(12) United States Patent
Hult et al.

(10) Patent No.: US 8,059,266 B2
(45) Date of Patent: Nov. 15, 2011

(54) RADIOMETRIC KIRK TEST

(75) Inventors: David A. Hult, Danbury, CT (US);
Heine Melle Mulder, Veldhoven (NL);
Minne Cuperus, Veldhoven (NL)

(73) Assignees: ASML Holding N.V., Veldhoven (NL);
ASML Netherlands B.V., Veldhoven (NL)

( * ) Notice: Subject to any disclaimer, the term of this patent is extended or adjusted under 35 U.S.C. 154(b) by 549 days.

(21) Appl. No.: 12/236,050

(22) Filed: Sep. 23, 2008

(65) Prior Publication Data
US 2009/0086179 A1    Apr. 2, 2009

Related U.S. Application Data

(60) Provisional application No. 60/976,111, filed on Sep. 28, 2007.

(51) Int. Cl.
*G01J 1/00* (2006.01)
*G03B 27/42* (2006.01)
*G03B 27/32* (2006.01)

(52) U.S. Cl. ............................ 356/121; 355/53; 355/77

(58) Field of Classification Search .................. 355/53, 355/55, 67; 356/121, 124, 213, 226
See application file for complete search history.

(56) References Cited

U.S. PATENT DOCUMENTS

| | | | | |
|---|---|---|---|---|
| 5,691,541 | A * | 11/1997 | Ceglio et al. | 250/492.1 |
| 5,721,608 | A * | 2/1998 | Taniguchi | 355/53 |
| 5,898,480 | A * | 4/1999 | Ozawa | 355/67 |
| 6,862,076 | B2 | 3/2005 | Mulder et al. | |
| 2005/0052651 | A1 * | 3/2005 | Kim | 356/433 |
| 2008/0068595 | A1 * | 3/2008 | Hagiwara | 356/124 |

FOREIGN PATENT DOCUMENTS

| | | |
|---|---|---|
| JP | 2004-289119 A | 10/2004 |
| JP | 2006-080245 A | 3/2006 |
| WO | WO 2006035925 A1 * | 4/2006 |

OTHER PUBLICATIONS

Machine translation of JP 2006-080245 published Mar. 23, 2006.*
English language Abstract of Japanese Patent Publication No. 2004-289119 A, Published Oct. 14, 2004; 1 page.
English language Abstract of Japanese Patent Publication No. 2006-080245 A, Published Mar. 23, 2006; 1 page.
English translation of Japanese Notification of Reasons for Refusal directed to related Japanese Patent Application 2008-250003, Japanese Patent Office, mailed Apr. 19, 2011; 2 pages.

* cited by examiner

*Primary Examiner* — Hung Henry Nguyen
*Assistant Examiner* — Steven H Whitesell Gordon
(74) *Attorney, Agent, or Firm* — Sterne, Kessler, Goldstein & Fox P.L.L.C.

(57) ABSTRACT

Systems and methods for measuring stray light in a lithographic apparatus are described using Radiometric Kirk Test (also known as Scanning SAMOS Test). The Radiometric Kirk Test of the present invention involves a test pattern having an isolated dark area within a much larger bright field. The radiometric Kirk test includes at least two continuous or stepped scans of an aperture of a detector in an image plane of a lithographic system. During a dark area measurement, the aperture of the detector is positioned such that at least at one point the aperture of the detector is centered within an image of the dark area. During a bright area measurement, the aperture of the detector is positioned within the image of the bright field. The integrated detector signal is correspondingly computed for the dark area measurement and the bright area measurement. The ratio of the integrated dark area measurement result and integrated bright area measurement result is a measure of stray light present in the lithographic apparatus.

29 Claims, 17 Drawing Sheets

RADIOMETRIC KIRK TEST

CROSS REFERENCE TO RELATED APPLICATION(S)

This application claims the benefit of U.S. Provisional Application No. 60/976,111, filed Sep. 28, 2008, which is incorporated by reference herein in its entirety.

BACKGROUND

1. Field of the Invention

This invention relates to a lithographic projection apparatus and systems and methods for measuring stray light in a lithographic projection apparatus.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), and other devices involving fine structures.

In some lithographic apparatus, a patterning device, which is alternatively referred to as a mask or a reticle, may be used to generate a circuit pattern to be formed on an individual layer of the substrate. This pattern can be transferred onto a target portion (e.g., comprising part of, one, or several dies) on a substrate (e.g., a semiconductor wafer). The lithographic apparatus comprises an illumination system to illuminate the mask and a projection system (also referred to as a projection lens) to transfer the mask's pattern, via imaging, onto a layer of radiation-sensitive material (photo-resist) provided on the substrate. In general, a single substrate will contain a network of adjacent target portions that are successively patterned.

Instead of a mask, in some lithographic apparatus, the patterning device can be a patterning array that comprises one or more arrays of individually controllable elements. Sometimes, the pattern can be changed more efficiently in a maskless system compared to a mask-based system. These types of apparatus are referred to as Optical Maskless Lithographic (OML) apparatus.

Known lithographic apparatus include so-called steppers or step-and-repeat apparatus, and so-called scanners or step-and-scan apparatus. In a stepper each target portion is irradiated by exposing an entire pattern onto the target portion at one time, and the wafer is moved by a predetermined amount to a next position for a subsequent exposure. In a scanner, each target portion is irradiated by scanning the pattern through a radiation beam in a given direction (the "scanning"-direction) while synchronously scanning the substrate parallel or anti-parallel to this direction, and next the wafer is moved to a next position for a subsequent exposure.

In order to achieve optimum performance in a mask-based or OML apparatus, monitoring the effect of stray light is important.

Stray light is measured on lithography systems using two primary methods: the Stray light At Multiple Object Size (SAMOS) test and the Kirk test.

The SAMOS test is a radiometric measurement that positions an image-plane detector (i.e., a detector placed in the wafer plane) within the image of a dark box surrounded by a bright field. The detector aperture is usually smaller than the image of the dark box. The light falling on the detector is an indication of amount of stray light present in the system. Details about the SAMOS test are described in U.S. Pat. No. 6,862,076 B2, which is incorporated herein by reference in its entirety.

The Kirk test is a lithographic measurement involving printing dark boxes (surrounded by bright fields, similar to the SAMOS test) into a photo-resist at increasing radiation or dose levels. The dose at which a dark box is not imaged into the photo-resist gives a measure of the stray light present in the system. In some embodiments, the Kirk test is implemented in positive photo-resist with multiple dark box sizes. Intensity is increased until the boxes of interest disappear. So, this test is also referred to as the "disappearing box test." The Kirk test is not limited to positive photo-resist. For example, when a negative photo-resist is used, intensity is increased until boxes of interest appear.

Both the SAMOS test and the Kirk test are valuable tools for measuring the performance of lithography apparatus in the presence of stray light, but SAMOS is often used for its relative simplicity, because no wafer processing is involved. However, either of the SAMOS test and the Kirk test alone does not provide an accurate measure of stray light in a lithographic apparatus aiming to achieve a very high contrast and a desired critical dimension of features. Additionally, SAMOS test is not a reliable method to measure stray light, where an imaging field of the lithography apparatus is small for each step of exposure, for example, in an OML apparatus.

SUMMARY

What is needed is a versatile system and method that embody the desirable features of the radiometric SAMOS test and the lithographic Kirk test to achieve accurate measurement of stray light in various lithographic apparatus having various configurations and imaging field sizes.

The present invention monitors the performance of a lithographic apparatus by measuring stray light. Embodiments of the present invention enables accurate measurement of stray light by virtually extending imaging fields of mask-based or maskless lithographic apparatus. Accuracy of stray light measurement is improved substantially by embodiments of the present invention, compared to accuracy achievable in a conventional radiometric SAMOS test method or a conventional lithographic Kirk test method.

According to an aspect of the invention there is provided a lithographic projection apparatus comprising an illumination system configured to produce a beam of radiation, a test pattern having a dark area surrounded by a substantially larger bright area that receives the beam, a detector having an aperture in an image plane, a positioning mechanism configured to position the aperture of the detector aligned to an image of the dark area and an image of the bright area, a moving mechanism configured to move the aperture of the detector across the image plane during a dark area measurement and a bright area measurement, a transducer coupled to the detector that measures radiation intensity during the dark area measurement and the bright area measurement, a processor coupled to the transducer that compares integrated signals from the dark area measurement and the bright area measurement to generate a final result that indicates effects of stray light in the lithographic apparatus, and an output indicator that communicates the results of the stray light measurement.

According to a further aspect of the invention there is a method for measuring stray light in a lithographic apparatus, wherein the method comprises the steps of: providing a test pattern configured to receive a beam of radiation, wherein the test pattern comprises a dark area surrounded by a substantially larger bright area; providing a detector having an aperture in an image plane where a projected image of the test pattern is created; positioning the aperture of the detector at a first location aligned to an image of the dark area; moving the aperture of the detector synchronously with or across the image of the dark area; measuring radiation intensity detected during the movement synchronously with or across the image of the dark area to yield a first integrated signal representing a result of the dark area measurement; positioning the aperture of the detector at a second location aligned to an image of the bright area; moving the aperture of the detector synchronously with or across the image of the bright area; measuring radiation intensity detected during the movement synchronously with or across the image of the bright area to yield a second integrated signal representing a result of the bright area measurement; comparing the first integrated signal and the second integrated signal to yield a final result that indicates effects of stray light in a lithographic apparatus; and indicating the final result as an output to facilitate monitoring and evaluation of performance of the lithographic apparatus based on the final result.

Further embodiments, features, and advantages of the present inventions, as well as the structure and operation of the various embodiments of the present invention, are described in detail below with reference to the accompanying drawings. For example, it is possible to vary reference positions of the test pattern and/or the aperture of the detector to measure position dependency of stray light across a complete imaging field.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
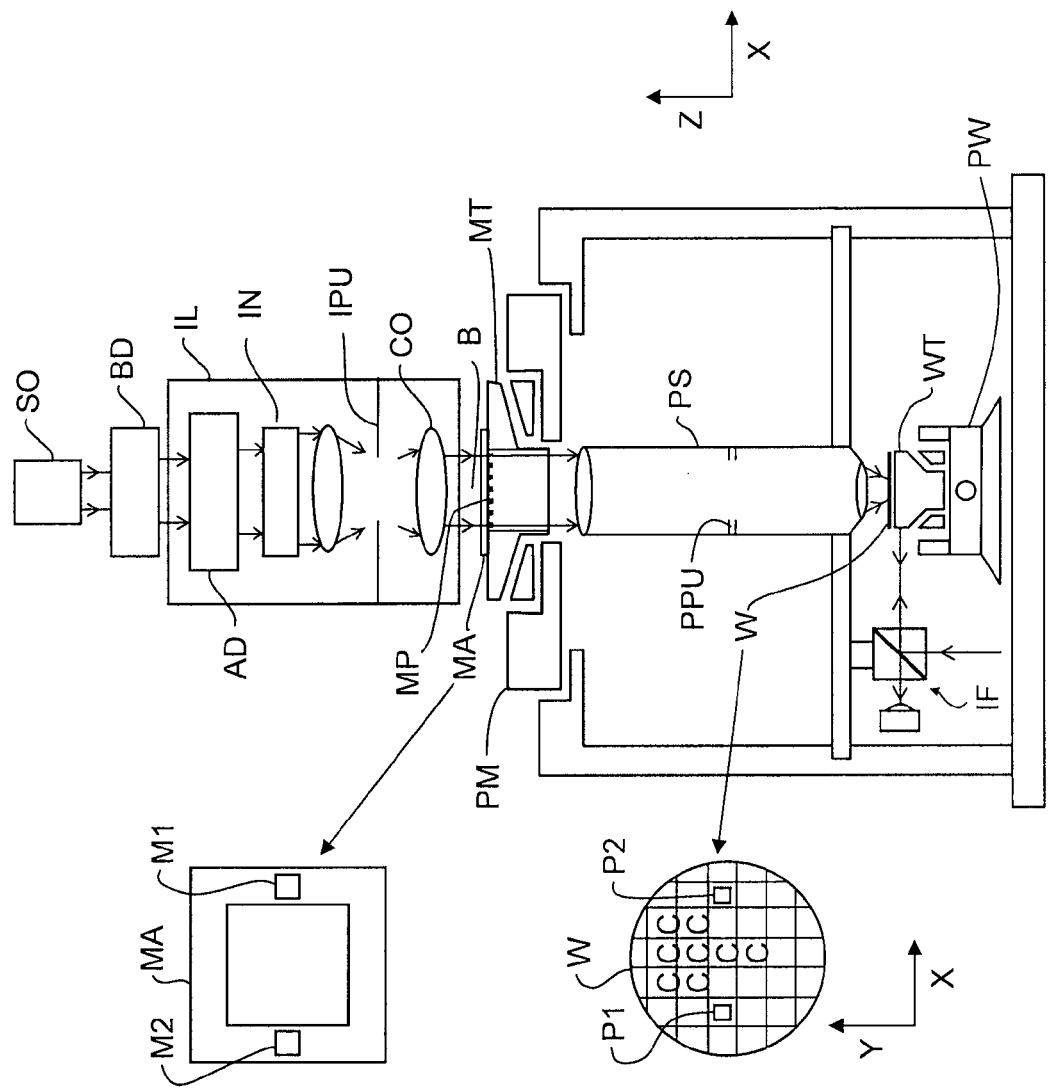
FIG. 1 depicts a mask-based lithographic apparatus according to an embodiment of the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

As discussed above, measurement of stray light is important to evaluate overall performance of a lithographic apparatus. Stray light measurement data is often supplied to support the system specification of a lithographic apparatus. In general, presence of stray light degrades image contrast, adversely affects overall performance of a lithographic apparatus. Persons skilled in the art will appreciate that a performance of a lithographic apparatus may be evaluated by a critical dimension of feature that can be projected on a substrate consistently with a desired contrast and uniformity. Periodic monitoring of stray light facilitates in evaluating the consistency of performance of a lithographic apparatus. If stray light measurement indicates a degradation of performance over time or an abrupt degradation of performance, then components in the optical path may be inspected for possible damage or contamination, and may be replaced, repaired, or cleaned accordingly to restore better performance of the lithographic apparatus. Additionally, stray light measurement data can be an useful calibration tool to adjust operational parameters (such as radiation dose level) of a lithographic apparatus.

This specification discloses one or more embodiments that incorporate the features of the present invention involving stray light measurement with improved accuracy. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 2:
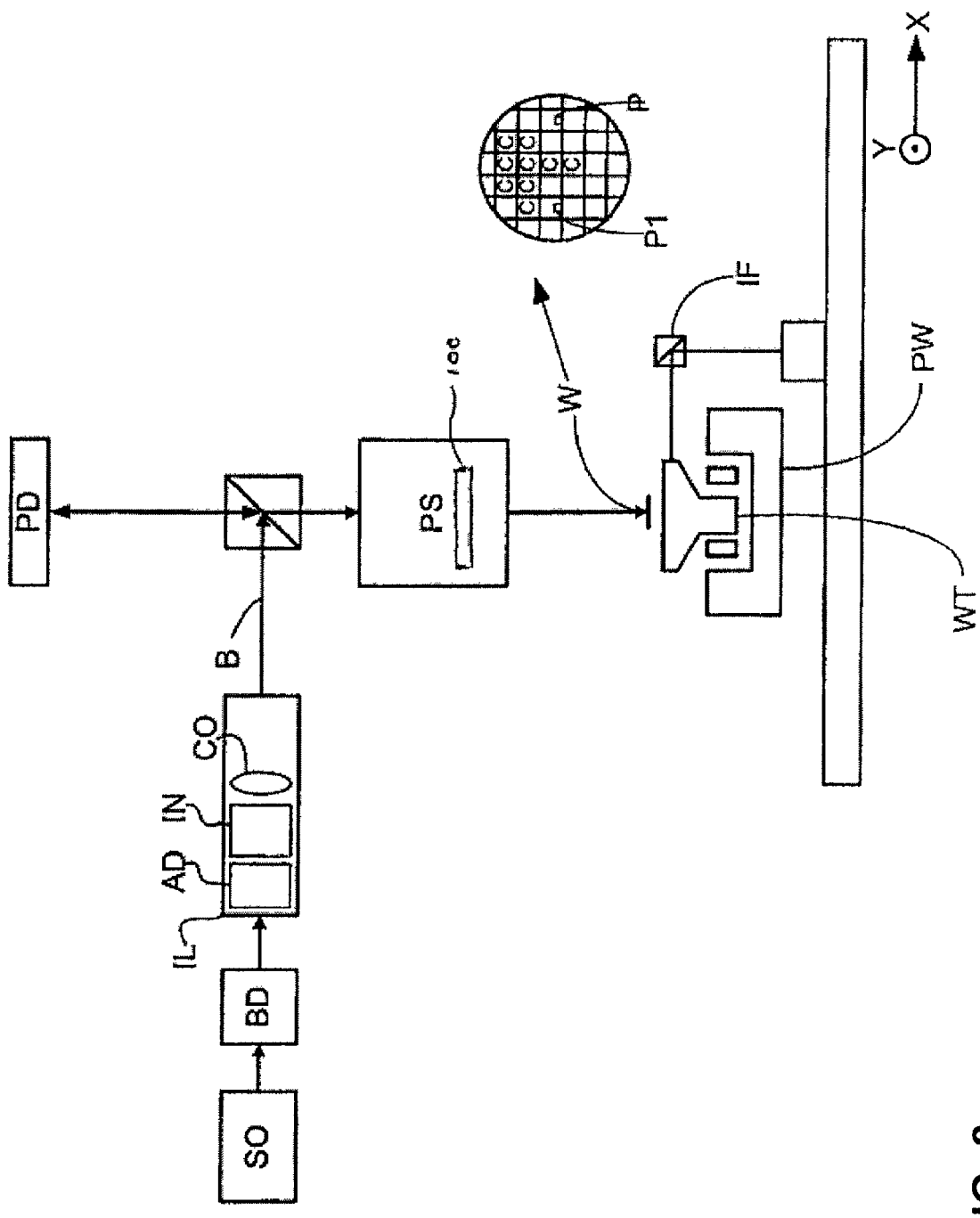
FIGS. 2 and 3 depict maskless lithographic apparatus, according to various embodiments of the present invention.
Figure 3:
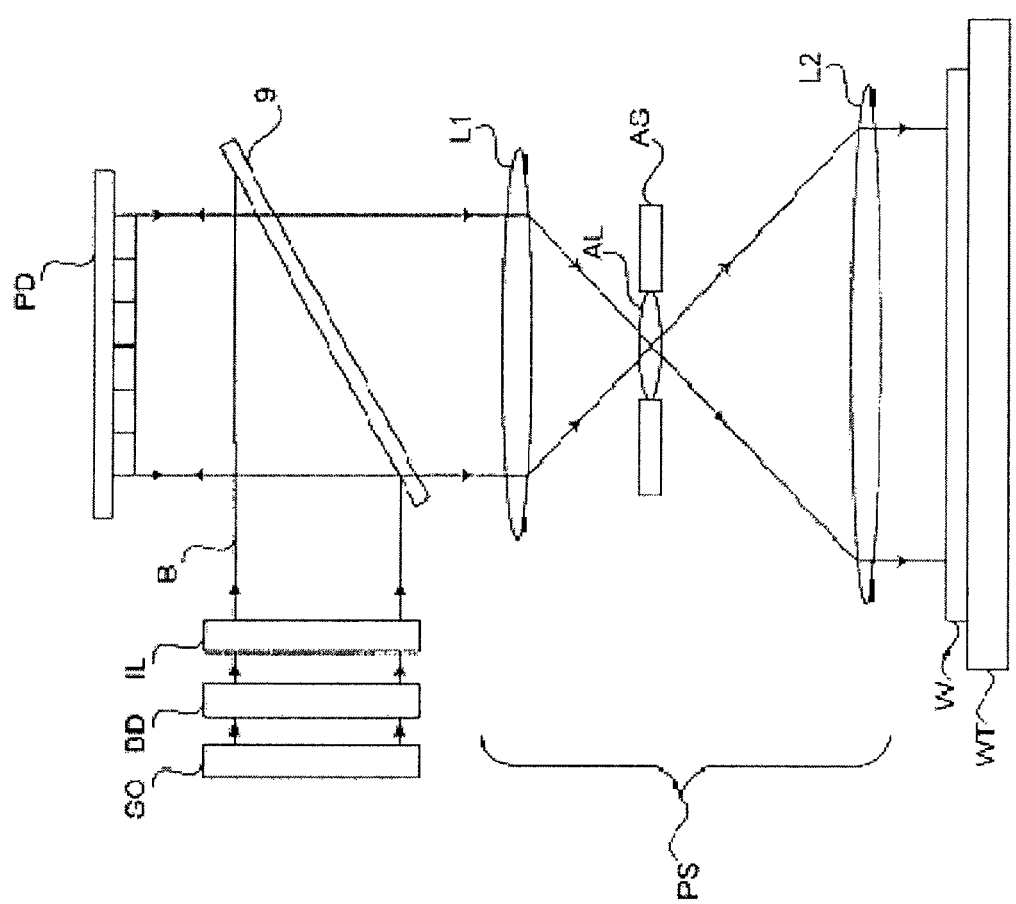
Figure 9:
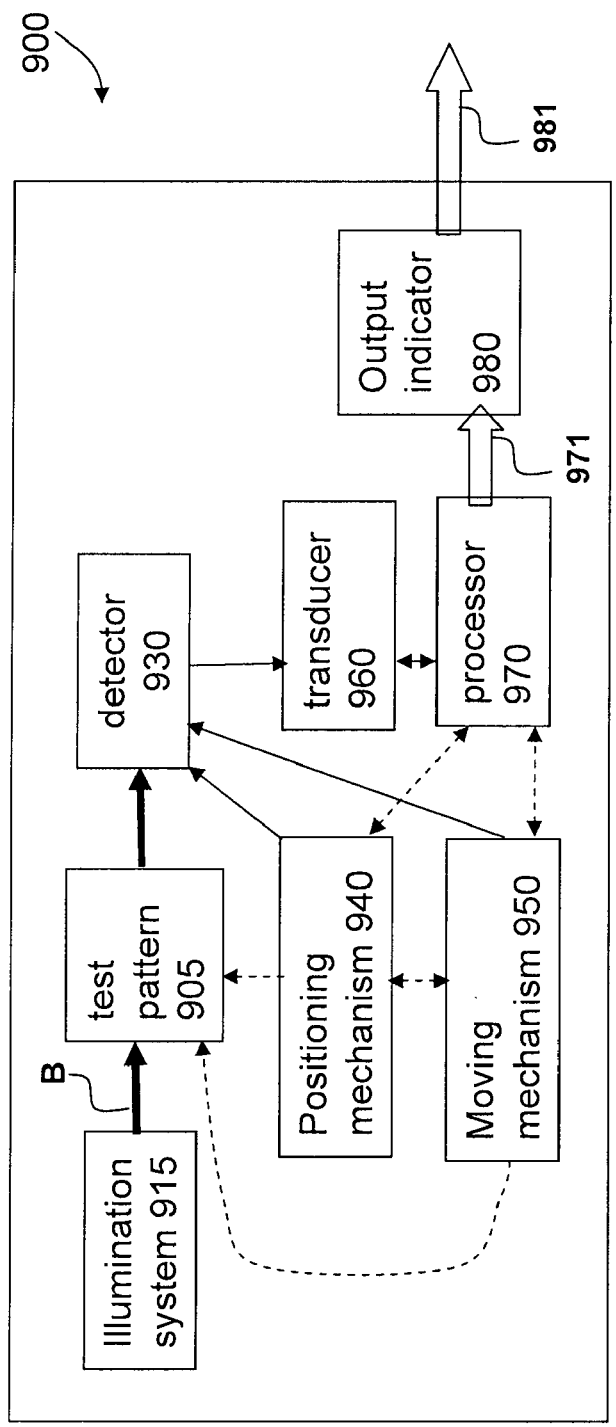
FIG. 9 shows example system components used in embodiments of the present invention.
Figure 10:
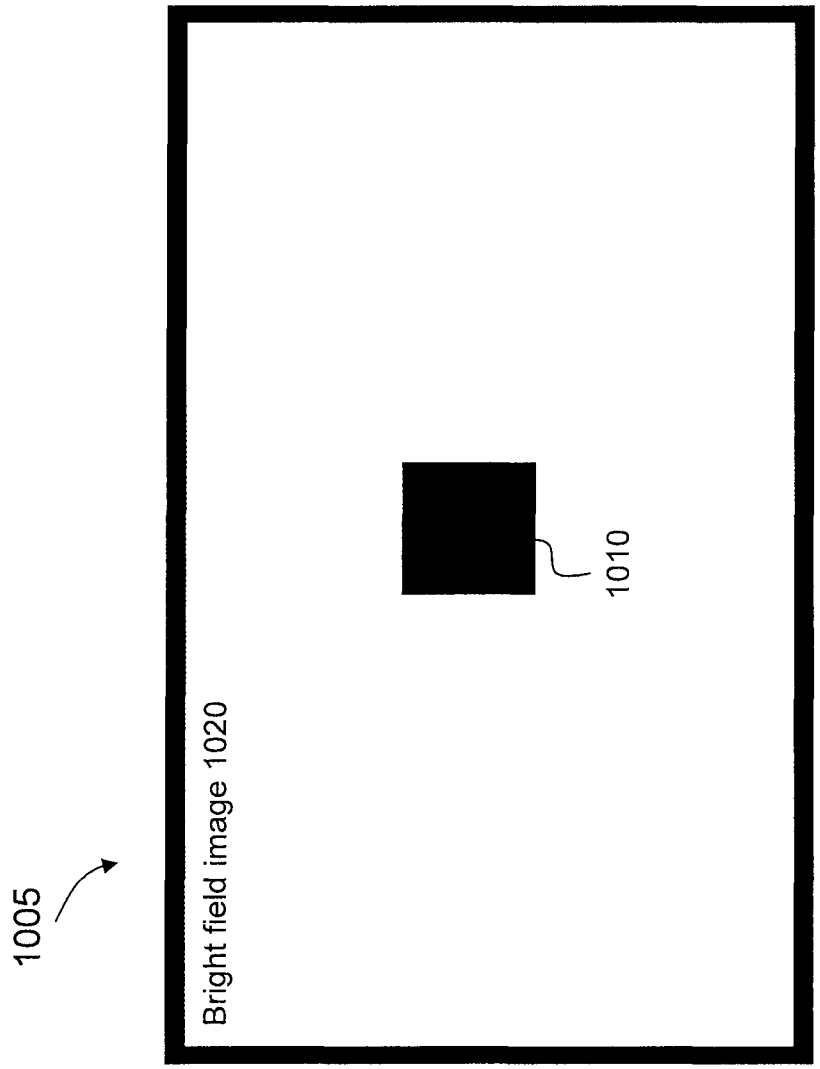
FIG. 10 illustrates an image of a test pattern, according to an embodiment of the present invention.
Figure 14C:
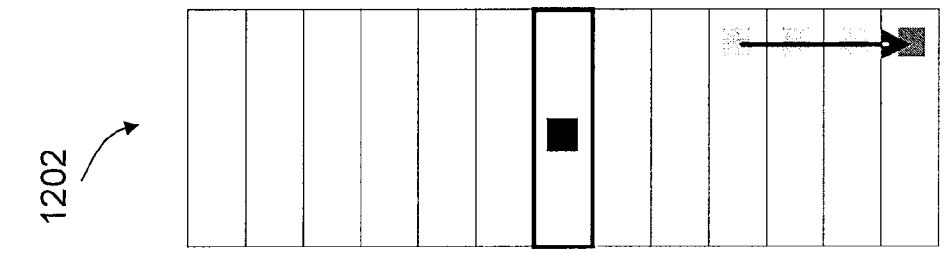
Figure 14B:
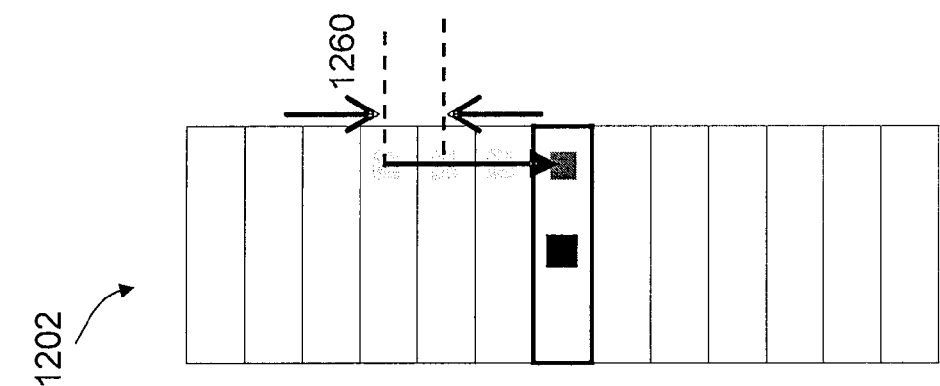
Figure 14A:
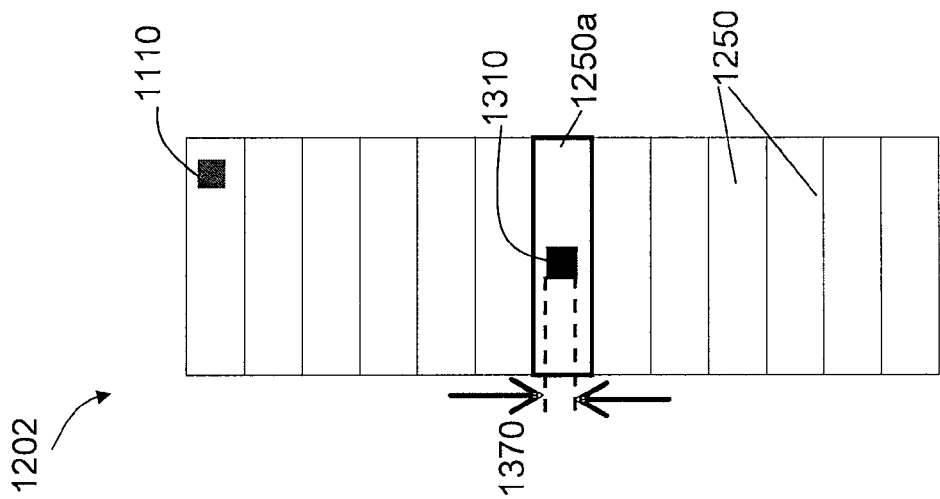
Figure 15:
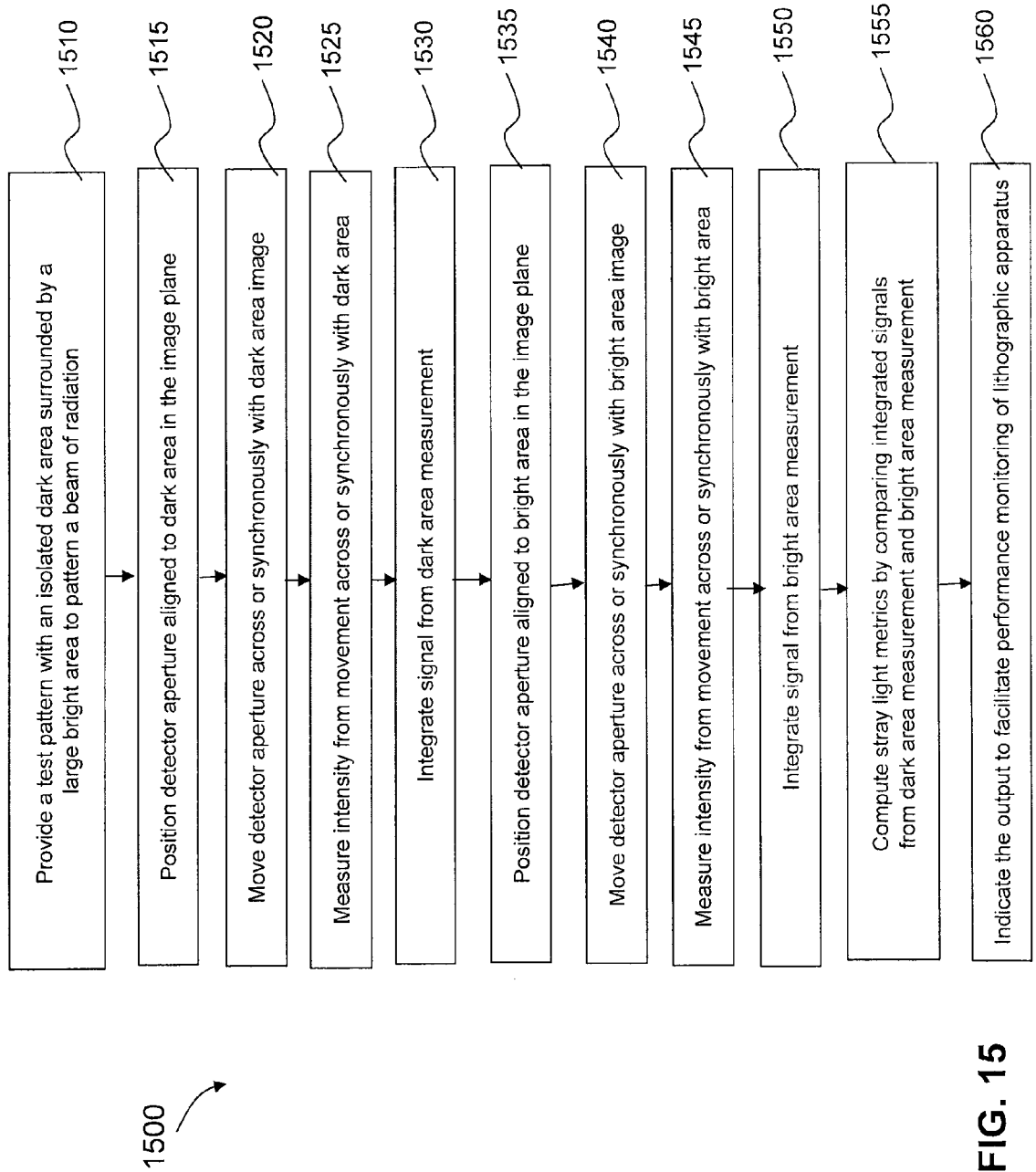
FIGS. 15 and 16 show flowcharts listing example method steps performed by embodiments of the present invention.
Figure 16:
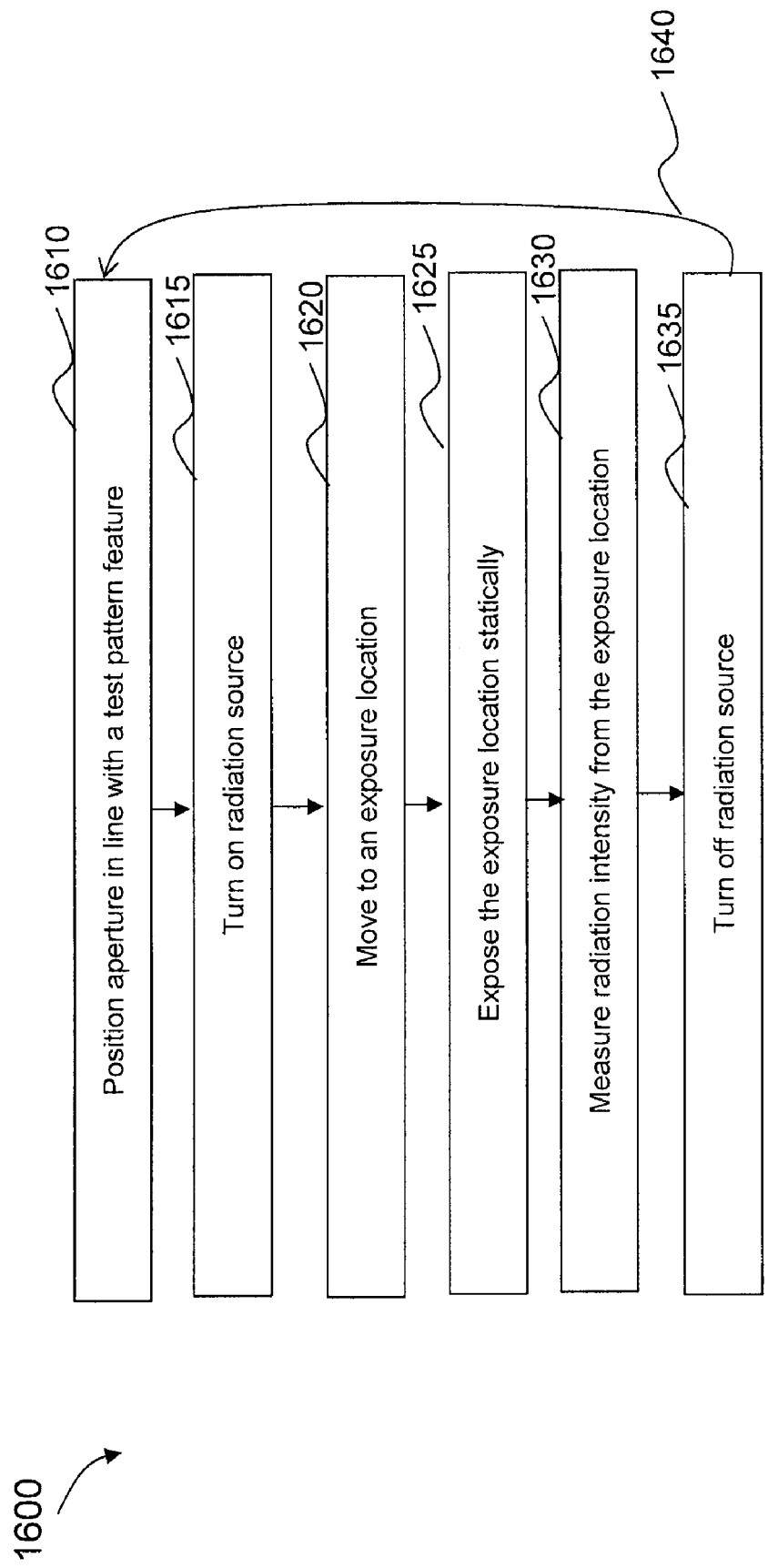

In the following sections, FIGS. 1-3 and related description discuss various lithographic apparatus where embodiments of the present invention may be used to measure stray light. FIG. 1 depicts a mask-based or reticle-based lithographic apparatus where a first embodiment of the invention can be used. FIGS. 2 and 3 depict an OML apparatus where another embodiment of the invention can be used. Background principles of radiometric Kirk test are illustrated via FIGS. 4-8 and related text. FIG. 9 depicts example components used in a radiometric Kirk test configuration. FIGS. 10-11 and related text illustrate embodiments of radiometric Kirk test for mask-based lithography systems. FIGS. 12-14 and related description illustrate embodiments of radiometric Kirk test for maskless lithography systems. FIGS. 15-16 and related description illustrate example steps of performing a radiometric Kirk test in a lithographic apparatus.

Mask-Based Lithographic Apparatus

The mask-based lithographic apparatus of FIG. 1 comprises:

- an illumination system IL configured to condition a radiation beam B (e.g., a beam of Ultra-Violet (UV) radiation as provided by a mercury arc lamp, or a beam of Deep Ultra-Violet (DUV) radiation generated by a Krypton Fluoride (KrF) excimer laser or an Argon Fluoride (ArF) excimer laser);
- a support structure (e.g., a mask table) MT constructed to support a patterning device (e.g., a mask) MA having a mask pattern MP and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by the pattern MP of the patterning device MA onto a target portion C (e.g., comprising one or more dies) of the substrate W.

The illumination system may include various types of optical components, such as refractive, reflective, and diffractive types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit. In the context of a mask-based embodiment of the present invention, a "patterning device" is a reticle with a test pattern comprising an isolated dark area surrounded by a much larger bright area.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illumination system IL receives a radiation beam from a radiation source SO, such as for example a mercury-arc lamp for providing g-line or i-line UV radiation, or an excimer laser for providing DUV radiation of a wavelength of less than about 270 nm, such as, for example 248, 193, 157, 126, 13.5, and 11 nm. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system can be adjusted. In addition, the illumination system IL may comprise various other components, such as an integrator IN and a condenser CO. The illumination system may be used to condition the radiation beam, to have a desired uniformity and intensity distribution in its cross-section at mask level.

The radiation beam B is incident on the patterning device (e.g., mask MA), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil PPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Maskless Lithographic Apparatus

FIG. 2 depicts an OML apparatus where another embodiment of the invention can be used. The apparatus in FIG. 2 comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the one or more arrays of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD is one or more arrays of individually controllable elements that modulate the beam. In the context of a maskless embodiment of the present invention, a "patterning device" is one or more arrays of individually controllable elements that can project an image of a test pattern comprising an isolated dark area surrounded by a much larger bright area.

An array of individually controllable elements is referred to as a Spatial Light Modulator or SLM in the subsequent description. There may be more than one SLMs in a lithographic apparatus. For example, in an embodiment of an OML apparatus, 14 SLMs are used in a two-row configuration. In general, the position of a SLM will be fixed relative to the projection system PS. However, it can instead be connected to a positioner configured to accurately position the SLM in accordance with certain parameters.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

The lithographic apparatus can comprise one or more contrast devices. For example, it can have a plurality of SLMs, each element of which is controlled independently of each other. In such an arrangement, some or all of the SLMs can have at least one of a common illumination system (or part of an illumination system), a common support structure for the SLMs, and/or a common projection system (or part of the projection system).

In one example, the substrate W is a wafer, for instance a semiconductor wafer. The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the SLMs, such that the pattern is coherently formed on the substrate. Alternatively, the projection system can image secondary sources for which the elements of the SLMs act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of elements in SLMs in the patterning device is equal to or greater than the number of focusing elements in the array of focusing elements. One or more (e.g., 1,000 or more, the majority, or each) of the focusing elements in the array of focusing elements can be optically associated with one or more of the individually controllable SLM elements, with 2 or more, 3 or more, 5 or more, 10 or more, 20 or more, 25 or more, 35 or more, or 50 or more of the individually controllable SLM elements.

The MLA can be movable (e.g., with the use of one or more actuators) at least in the direction to and away from the substrate. Being able to move the MLA to and away from the substrate allows, e.g., for focus adjustment without having to move the substrate.

As herein depicted in FIGS. 2 and 3, the apparatus is of a reflective type (e.g., employing a reflective SLM). Alternatively, the apparatus can be of a transmission type (e.g., employing a transmission SLM).

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 2, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm or even shorter wavelengths.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable SLM elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., one or more SLMs) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the SLM can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 2. In another example, a short stroke stage cannot be present. A similar system can also be used to position the SLMs. It will be appreciated that the beam B can alternatively/additionally be moveable, while the object table and/or the SLMs can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 2, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 2 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 2 cannot be required if a transmission patterning device is used.

The depicted apparatus in FIG. 2 can be used in several modes:

1. In step mode, the SLMs and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the SLMs and the substrate are scanned synchronously while a pattern imparted to the radiation beam is projected onto a target portion C (i.e., a single dynamic exposure). The velocity and direction of the substrate relative to the SLMs can be determined by the (de-) magnification and image reversal or image mirroring characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the SLMs are kept essentially stationary and the entire pattern is projected onto a target portion C of the substrate W using a pulsed radiation source. The substrate table WT is moved with an essentially constant speed such that the beam B is caused to scan a line across the substrate W. The pattern on the SLMs is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the SLMs is updated as the beam B scans across the substrate W and exposes it. A substantially constant radiation source or a pulsed radiation source, synchronized to the updating of the pattern on the SLMs, can be used.

5. In pixel grid imaging mode, which can be performed using the lithographic apparatus of FIG. 3, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the SLM elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable SLM elements to provide a zero or significantly lower radiation intensity.

FIG. 3 depicts an example arrangement of the OML apparatus. Components corresponding to those shown in FIG. 2 are depicted with the same reference numerals. Also, the above descriptions of the various embodiments, e.g., the various configurations of the substrate, the contrast device, the MLA, the beam of radiation, etc., remain applicable.

As shown in FIG. 3, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

Referring back to FIG. 2, in accordance with one embodiment of the present invention, a pupil plane array of individually programmable elements 100 is oriented at the pupil plane of projection system PS. As is known by persons skilled in the relevant art(s), the location of the pupil plane is determined by features of optical instrumentation included within a projection system. Accordingly, the location of pupil plane array of individually programmable elements 100 is determined by the location of the pupil plane of projection system PS. For example, in one embodiment, pupil plane array of individually programmable elements is located within a housing of projection system PS (shown in FIG. 2).

In one example, a positioning device (not shown) for pupil plane array of individually programmable elements 100 can be used to accurately correct the position of pupil plane array of individually programmable elements with respect to the path of beam B, e.g., during a scan. In one embodiment in which reflective device PD also comprises a array of individually programmable elements ("object plane array of individually programmable elements"), a second positioning device (not shown) can be used to accurately correct the position of object plane array of individually programmable elements PD with respect to the path of beam B.

In another example, movement of substrate table WT is realized with the aid of a long-stroke module (course positioning) and a short-stroke module (fine positioning), which are not explicitly depicted in FIG. 2. A similar system can also be used to position pupil plane array of individually programmable elements and/or patterning device PD. It will be appreciated that beam B may alternatively/additionally be moveable, while substrate table WT and/or pupil plane array of individually programmable elements and/or object plane array of individually programmable elements PD (when applicable) may have a fixed position to provide the required relative movement.

Although specific reference may have been made above to the use of embodiments of the invention in the context of mask-based or maskless optical lithography, it will be appreciated that the invention may be used in other applications. For example, embodiments of the present invention are equally applicable to mask-based or maskless lithographic apparatus, adapted to support immersion lithography.

Principles of the Conventional Kirk Test and SAMOS Test

As discussed above, embodiments of the present invention measure stray light with high accuracy in lithographic systems, such as the various example lithographic apparatus described with respect to FIGS. 1-3.

In a lithographic apparatus, every bright point in an imaging field scatters light across a projected image due to various reasons, such as, the effect of roughness on optical surfaces, index variation in optical path, internal reflections from optical elements, external reflections from outside objects, etc.

Figure 4B:
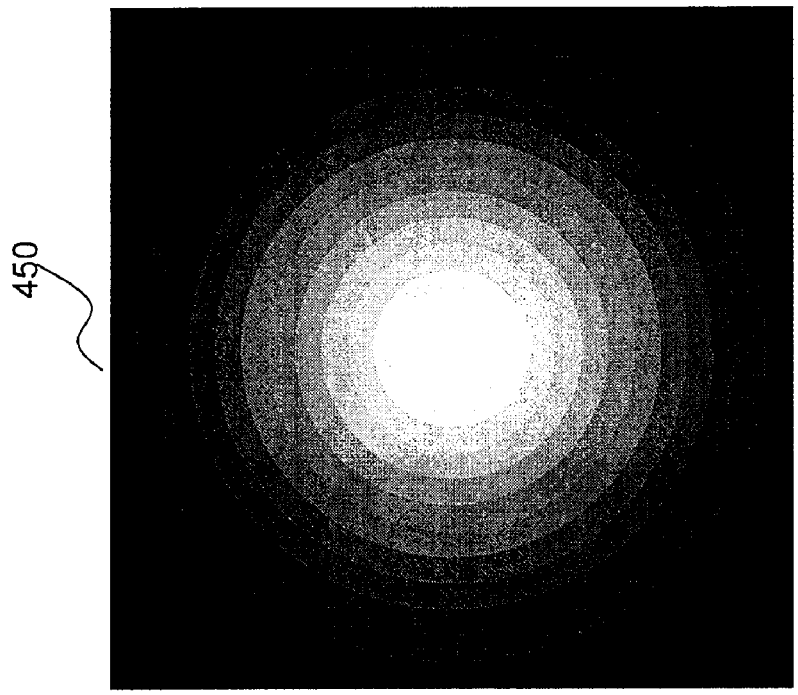
FIGS. 4A and 4B illustrate an intensity scatter function used in conventional tests for measuring stray light.
Figure 4A:
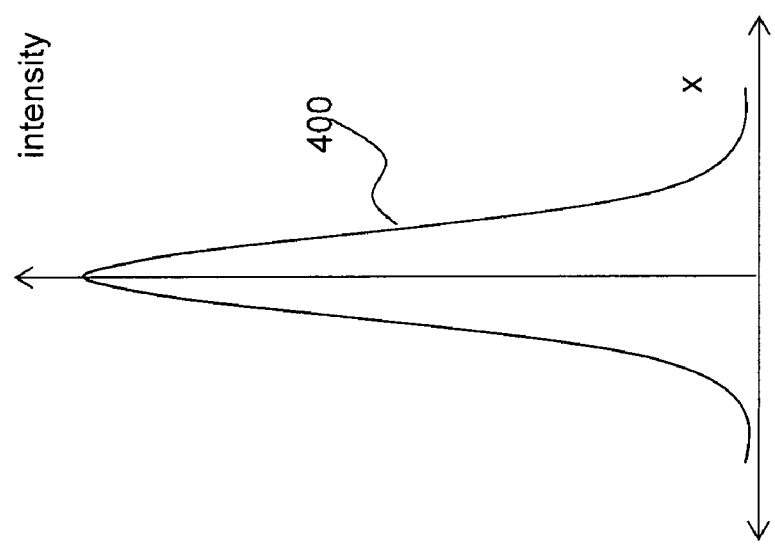

This scattered light is called stray light, and it has an effect on image contrast obtained by a lithographic apparatus. The intensity of this stray light falls off rapidly with distance. This intensity distribution over distance is described by an Intensity Scatter Function (ISF), where isotropy (i.e., ISF intensity varies only by radial distance and not angle) and stationarity (i.e., one ISF describes the stray light from any bright point, regardless of its position within the image field) are typically assumed for the purpose of analysis and understanding. FIG. 4A gives a simplified one dimensional depiction 400 of an ISF. FIG. 4B gives a simplified two-dimensional depiction 450 of the same ISF.

Contribution to stray light from a single bright point is very low in intensity at a measurable (microns or millimeters) distance from a projected center of the bright point in typical modern lithographic apparatus, but the integrated stray light at any one dark point in a field filled with many bright points (i.e., a bright field in a lithographic system) can be significant enough to affect imaging performance.

Since the intensity of stray light contributed from a single bright point is very low compared to a transmitted beam of radiation, the ISF may be difficult to measure directly. The intensity is so low in the dark areas, and so high in the bright area, that most detection mechanisms do not have adequate dynamic range for an accurate direct measurement. So lithographic Kirk test is used as an indirect method to integrate ISFs.

Figure 5:
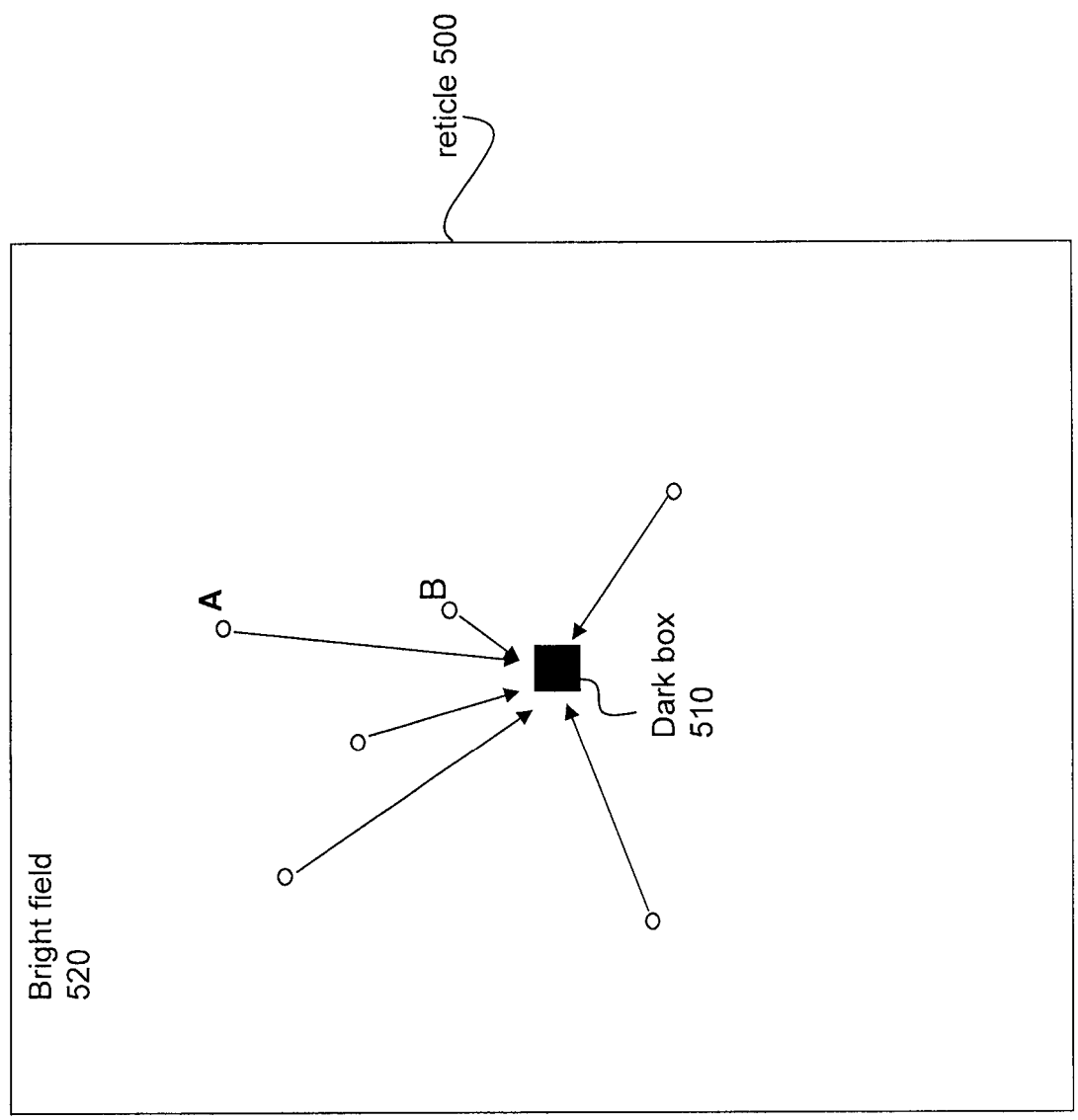
FIG. 5 shows a reticle configured to be used in a stray light measurement test according to embodiments of the present invention.

The lithographic Kirk test effectively duplicates convolution integration of ISFs from many bright points by imaging a small dark box in a large bright field. A bright field can be thought of as a collection of a very large number of individual bright points. The light in the center of the dark box (relative to the light in the bright field) is the stray light integrated from the many bright points. FIG. 5 depicts an example test pattern in a reticle 500 that can be used for Kirk test in a reticle-based lithographic system. Reticle 500 has a large bright field 520 and a dark box 510 in the center. Multiple bright points scatter light into the small dark box 510. Light from an example bright point at A scatters a longer distance to reach the dark box 510 than scattered light from another example bright point B. It is to be noted that though a square dark box 510 is depicted, the shape of the dark box is not limited to square only. It can be rectangular, circular or any other symmetric shape.

Figure 6:
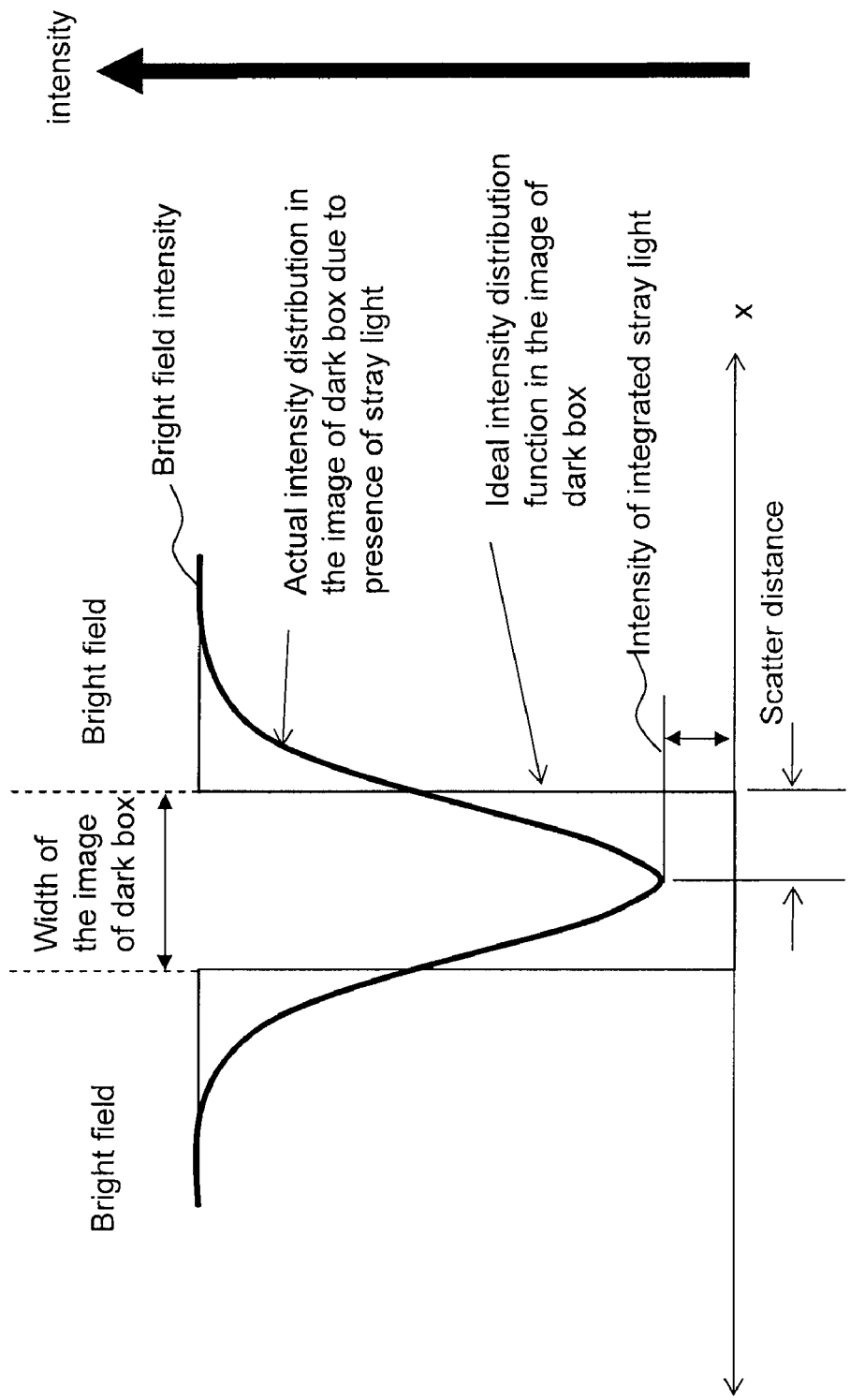
FIGS. 6 and 7 illustrate principles of a conventional Kirk test.

Assuming stationarity, the lithographic Kirk test may be simulated in a processor by convolving the measured stray light ISF with a function representing the image of an isolated dark box (e.g., dark box 510) in a large bright field (e.g., bright field 520). FIG. 6 depicts a one dimensional representation of the intensity distribution in the image of the dark box, which is not identical to the ideal intensity distribution due to the presence of stray light. In other words, the image of the dark box is less dark in reality, which is an indicator that the lithographic apparatus may not reproduce a pattern with a desirable contrast. For accurate simulation results, the convolution integration is performed by the processor in two-dimension, and the bright field is assumed to be large. It is further assumed that the dark area and the bright field are circular. The lower bound of the convolution integration corresponds to half the size of the image of the dark box, or the minimum distance that stray light must scatter to reach the center of the image of the box. The upper bound of the convolution integration corresponds to half the size of the image of the bright field, or the maximum distance that light must scatter to reach the center of the image of the dark box.

Figure 7:
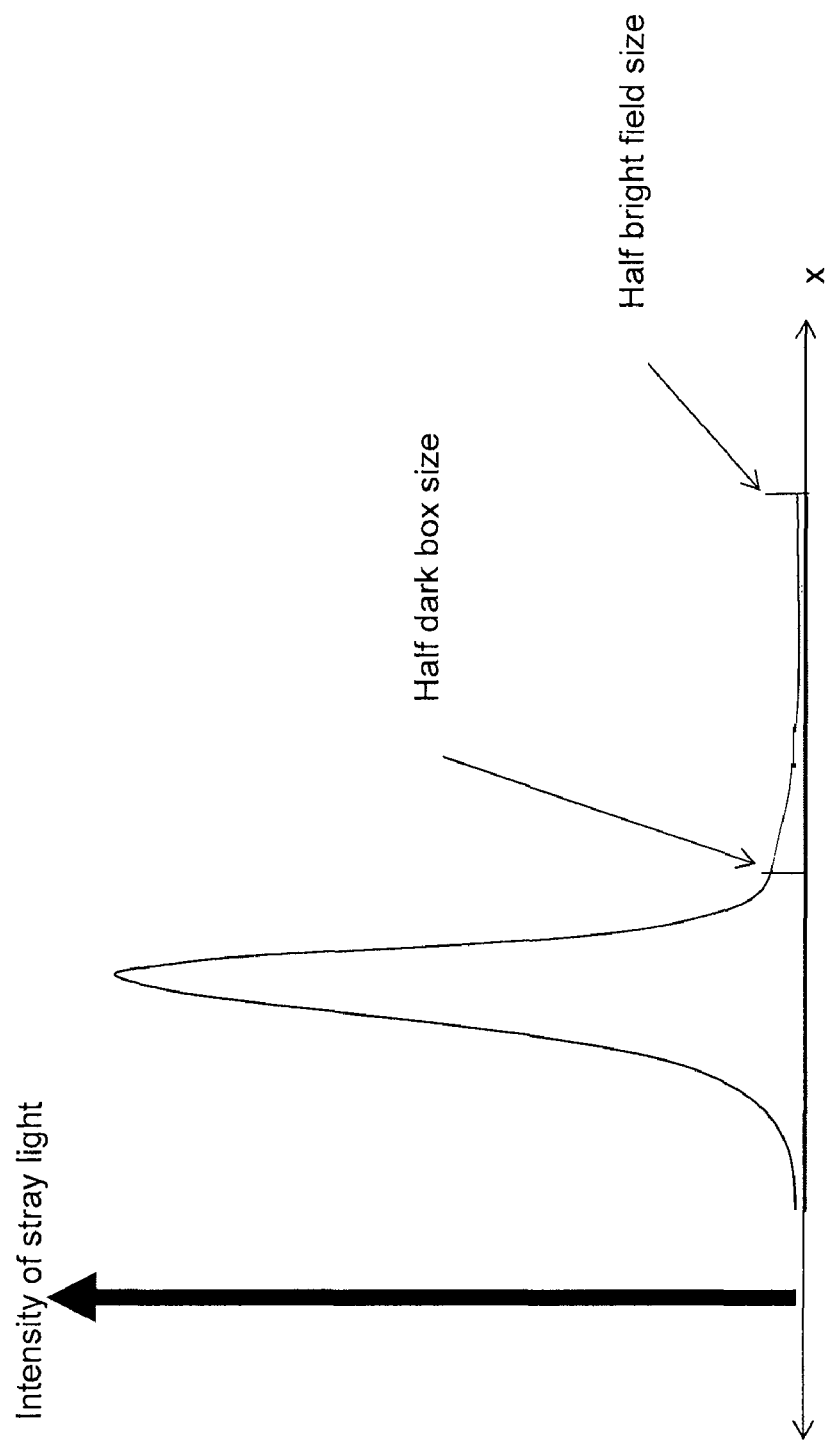
Figure 8:
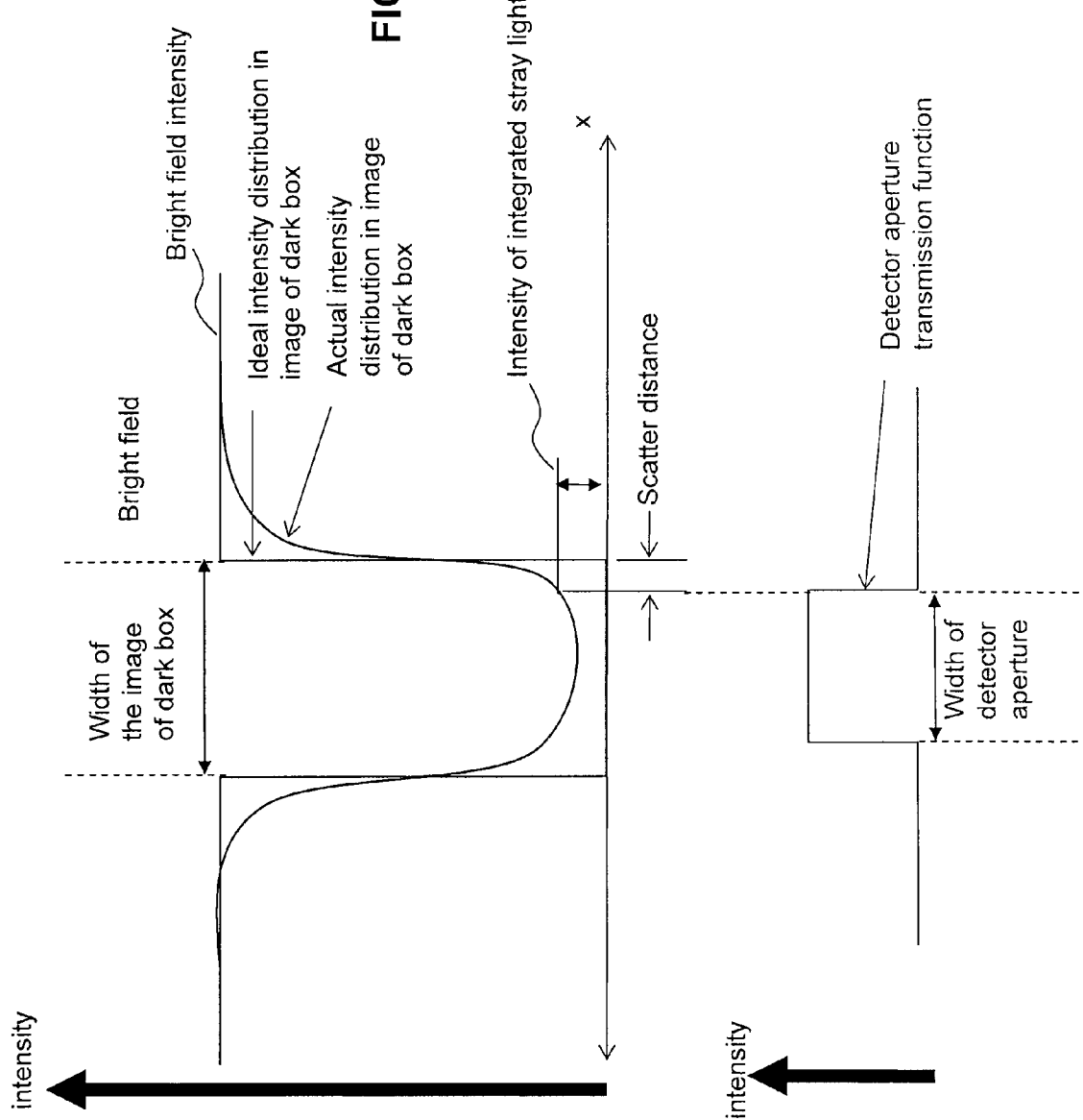
FIGS. 8A and 8B illustrate principles of conventional SAMOS test.

FIG. 7 depicts convolution integration limits of an ISF. The ISF in FIG. 7 is similar to what is shown in FIG. 4A. Stray light can be quantified when an ISF is convolved between half the dimension of the dark box and half the dimension of the bright field. Note that these convolution integration limits describe an annular ring centered on the ISF. Even though the stray light intensity falls off rapidly with radial distance from the ISF center, the integrated stray light may depend greatly on the size of the bright field, since the area of the annular ring increases rapidly with radius.

Reducing the upper bound by using a significantly smaller bright field will reduce the accuracy of the result of the test, not capturing all of the stray light that may be present in an actual full-field lithographic exposure. In order to simulate a comprehensive measurement of stray light, the size of the bright field is required to be increased by simulating a full-field scanning exposure. Embodiments of the present invention are capable of simulating a full-field scanning exposure by moving an aperture of a detector in an image plane in a predetermined manner, as in case of a conventional SAMOS test, which is a radiometric test.

The conventional SAMOS test has some similarities to the lithographic Kirk test in that it detects light scattering in from a large bright field into a small dark box. In the SAMOS test, the test pattern, (i.e., the image of the small dark box), does not move. An aperture of a detector is positioned sequentially in the bright field, and within the dark box. A conventional SAMOS test performs only static measurements in the dark and the bright area. No continuous or step-wise scanning of the detector is performed.

FIGS. 8A and 8B illustrate a one-dimensional depiction of the SAMOS test. FIG. 8B shows a detector aperture transmission function, and FIG. 8A shows the intensity distribution in the image of the dark box due to the presence of stray light. This intensity is sampled from measurements performed in the dark box and the bright field.

In a SAMOS test, when the aperture of the detector is positioned in the center of the dark box, light intensity in the center of the dark box relative to light intensity in the bright field is detected by the detector, and this ratio is a measure of stray light. Typical dark box sizes used in the SAMOS test are 33 μm and 108 μm. The size of the detector typically used is 28 μm. So, the scatter distance (as shown in FIG. 8A) is typically about 2.5 μm and 40 μm (box size/2−detector aperture size/2), corresponding to the 33 μm and 108 μm dark box, respectively. The 33 μm and 108 μm SAMOS dark box sizes correspond to about 5 μm and 80 μm boxes in a Kirk test (though the results are not equivalent and are not directly translatable in this manner). It is to be noted that the specific dimensions and shapes of the test pattern and detector aperture are discussed for illustrative purpose only; other dimensions and shapes of dark box can be used.

In the SAMOS test, the size of the imaging field is determined by the size of an imaging slit in a lithographic apparatus. The imaging field of a mask-based lithographic apparatus is usually large enough to obtain useful stray light measurement data. For example, in a particular reticle-based lithographic apparatus, an imaging field may be about 3-5 mm in length and about 26 mm in width on the image plane. Slit sizes may vary to about 8 mm in length for laser-based systems, and may be up to about 14 mm in length for lamp-based systems. However, the accuracy of stray light measurement increases in mask-based lithographic apparatus when the imaging field is "virtually" extended. This virtual extension of imaging field is not possible in the conventional SAMOS test. As discussed further below, embodiments of the present invention enables virtual extension of imaging field by scanning a detector.

In an OML apparatus, the imaging field for a single exposure is far smaller than conventional mask-based lithography apparatus. For this reason, the established SAMOS test, as currently implemented for larger imaging field mask-based lithographic apparatus, results in greatly reduced signal levels, and therefore, greatly degraded accuracy in stray light measurement in OML apparatus.

In an OML apparatus, an imaging field defined by a footprint of a SLM of the patterning device is typically only about 40 μm in length along a direction of scanning. A 40 μm imaging field dimension is too small to adequately surround a 33 μm dark box. In order to "virtually" increase the size of the imaging field in an OML apparatus, a full-field scanning exposure is simulated by embodiments of the present invention by performing a stepped exposure with suitably small step size.

It is to be noted that though the virtual enlargement of the imaging field is particularly useful for OML apparatus, where a conventional SAMOS test can not be applied, the virtual enlargement feature is useful to increase the accuracy of stray light measurement in a reticle-based lithographic apparatus as well.

System Embodiments of Radiometric Kirk Test

As discussed above, measuring stray light in an isolated dark part of an image is greatly aided when the dark part of the image is surrounded by a large bright field. A large bright field surrounding an isolated dark area gives increased signal levels on detector apertures and photo-resist. Thus, the radiometric Kirk test of the present invention involves a bright field reticle with at least one isolated dark area within the bright field.

The radiometric Kirk test includes at least two continuous or stepped scans of an aperture of a detector in an image plane of a lithographic system. Thus, it is also referred to as a "scanning SAMOS test". During the first continuous or stepped scan, referred here as the "dark area measurement" or the "dark field measurement" step, the aperture of the detector is positioned such that at least at one point during the dark area measurement, the aperture of the detector is centered within an image of the dark area. During another continuous or stepped scan, referred here as the "bright area measurement" or the "bright field measurement" step, the aperture of the detector is positioned within the image of the surrounding bright field. The integrated (or averaged) detector signal from the dark area scan and the bright area scan are correspondingly computed. The ratio of the former and later signal is a measure of stray light present in the lithographic apparatus. Additionally, persons skilled in the art will appreciate that by shifting the aperture of the detector and dark area of the test pattern at SLM or reticle level, position dependency of the effect of stray light may be determined.

FIG. 9 depicts a generic block diagram 900 showing example components used in a radiometric Kirk test configuration.

The test configuration includes a test pattern 905, an illumination system 915, a detector 930, a positioning mechanism 940, a moving mechanism 950, a transducer 960, a processor 970, and an output indicator 980. There may be additional components in the test configuration not shown in FIG. 9 that are included in order to effectively utilize an existing configuration of a lithographic apparatus. For example, a test configuration used for a reticle-based lithographic system may be suitably modified to be used in an OML apparatus, and vice versa.

The Illumination system 915 is configured to produce a beam of radiation B. This may be the illumination system IL shown in FIGS. 1-3.

The test pattern 905 receives the beam. The test pattern 905 is included on a physical reticle for a reticle-based system, or is created by one or more SLM arrays in case of an OML apparatus. The test pattern 905 comprises a dark area surrounded by a bright area, wherein the bright area is substantially larger than the dark area.

The configuration also includes the detector 930 that receives the beam patterned by the test pattern 905. The detector 930 has an aperture in an image plane where a projection system PS (as shown in FIGS. 1-3) creates a projected image of the test pattern 905 from the patterned beam. A shape of the aperture corresponds to a shape of the dark area on the test pattern 905. The detector 930 may be a transmission image sensor (TIS) detector. In some embodiments, the TIS is a ratio sensor (RS) detector.

The positioning mechanism 940 included in the configuration is coupled to detector 930, and is configured to position the aperture of the detector 930 at a first and a second location within the image of the test pattern 905, the first location being aligned to an image of the dark area, and the second location being aligned to an image of the bright area at a distance from the image of the dark area. In the embodiments where the image of the test pattern 905 is moved synchronously with the detector aperture, positioning system 940 may include a first positioning system coupled to the detector 930 (this coupling is shown by a solid arrow in FIG. 9), and a second positioning system coupled to the patterning device that creates the test pattern 905 (this coupling is shown by a dotted arrow in FIG. 9). Positioning mechanism 940 may employ physical or virtual fiducial marks and/or machine vision technology to fine-tune relative positioning of the detector aperture and the test pattern 905.

The configuration also includes moving mechanism 950 coupled to the detector 930 that is configured to move the aperture of the detector 930 in a predetermined manner across the image plane. Note that positioning mechanism 940 and moving mechanism 950 may be combined in a single system, or they may be separate functional blocks that communicate with each other (as shown by a dotted bidirectional arrow in FIG. 9). Also, in the embodiments where the image of the test pattern 905 is moved synchronously with the detector aperture, moving mechanism 950 may include a first moving mechanism coupled to the detector 930 (this coupling is shown by a solid arrow in FIG. 9), and a second moving mechanism coupled to the patterning device that creates the test pattern 905 (this coupling is shown by a dotted curved arrow in FIG. 9). One skilled in the art will appreciate that the moving mechanism 950 may be configured to perform a continuous scan, or a stepped scan. Appropriately small steps may be chosen in a stepped scan (e.g., in an OML apparatus) to mimic a continuous scan.

The transducer 960 is coupled to the detector 930. The detector 930 detects radiation intensity during the dark area scan and the bright area scan, and the transducer 960 converts the detected intensity into measurable signals. In some embodiments, measured intensity data is actually a ratio of a transmissive intensity detected by a ratio sensor (RS) detector in image plane (the signal from which is referred to as an RS signal), and intensity detected by an intensity monitor (also referred to as an "energy sensor" (ES), the signal from which is referred to as an ES signal) located within the illuminator 915, that detects intensity before the beam is received by the test pattern 905. The RS signal varies with its position within the image and the radiation pulse energy. The ES signal only varies with the radiation pulse energy. Thus, the recorded ratio of the two signals is only a function of the RS detector position within the image plane. In this manner, the accuracy of the intensity measurements is not degraded by noise in the radiation pulse energy. Note that detector 930 and transducer 960 may be two separate functional units, or may be combined together.

The processor 970 coupled to the transducer receives measured signals from the transducer 960, and integrates the measured signals to yield a first integrated signal representing a result of the dark area scan, and a second integrated signal representing a result of the bright area scan. The processor 970 further compares the first integrated signal and the second integrated signal to generate a final result that indicates quantity and/or effects of stray light in the lithographic apparatus. A signal representing the final result is sent to the output indicator 980.

Note that processor 970 may be a separate functional unit, or combined with transducer 960 in some embodiments. Additionally, the processor 970 may communicate with the positioning mechanism 940 alone, or both the positioning mechanism 940 and the moving mechanism 950, in order to fine-tune alignment and movement of the detector (and the test pattern, where applicable) during the dark area scan and the bright area scan. This possibility is shown by two bidirectional arrows coupling the processor 970 with the positioning mechanism 940 and the moving mechanism 950.

The output indicator 980 is be a module coupled to the processor 970, that receives processed final result signal 971, and generates an output 981 based on the signal 971. The output 981 is communicated to a manual operator of the lithographic apparatus, or to an automated system, for the purpose of monitoring and evaluating the performance of the apparatus. The output indicator 980 may be located within the test configuration, or may be located away from the lithographic apparatus. For example, the output 981 may be transmitted to an instrumentation computer (not shown) having a graphic user interface that displays the output. Correctional measures can be taken if a degradation of performance is indicated by the output indicator 980. For example, a lens in the optical path may be cleaned or replaced or repaired to reduce effects of stray light enhancing bright spots. In some embodiments, operational parameters (such as, a correct radiation dose, or a correct alignment of a patterning device, etc.) of the lithographic apparatus may be controlled by a control module (not shown), or may be manually adjusted, based on the output 981 generated by output indicator 980.

FIG. 10 refers to a reticle-based embodiment of the test, where a projected image 1005 of a test pattern is used. The test pattern is included on a test reticle. The test reticle is similar to reticle 500 shown in FIG. 5 with the test pattern comprising an isolated dark area 510 surrounded by a much larger bright area 520. There may be a plurality of isolated dark areas 510 in the test pattern, each surrounded by a sufficiently large bright field 520. The test pattern receives a beam of radiation and patterns the beam. A projected image of dark area 510 is shown as image 1010 in FIG. 10, and a projected image of bright field 520 is shown as image 1020 in FIG. 10. Images 1010 and 1020 are created on the image plane (sometimes referred to as the wafer plane). As discussed before, the dark box 510 (and therefore shape of the image 1010) may have a shape of a square, a rectangle, a circle, or any other symmetric shape.

Figure 11A:
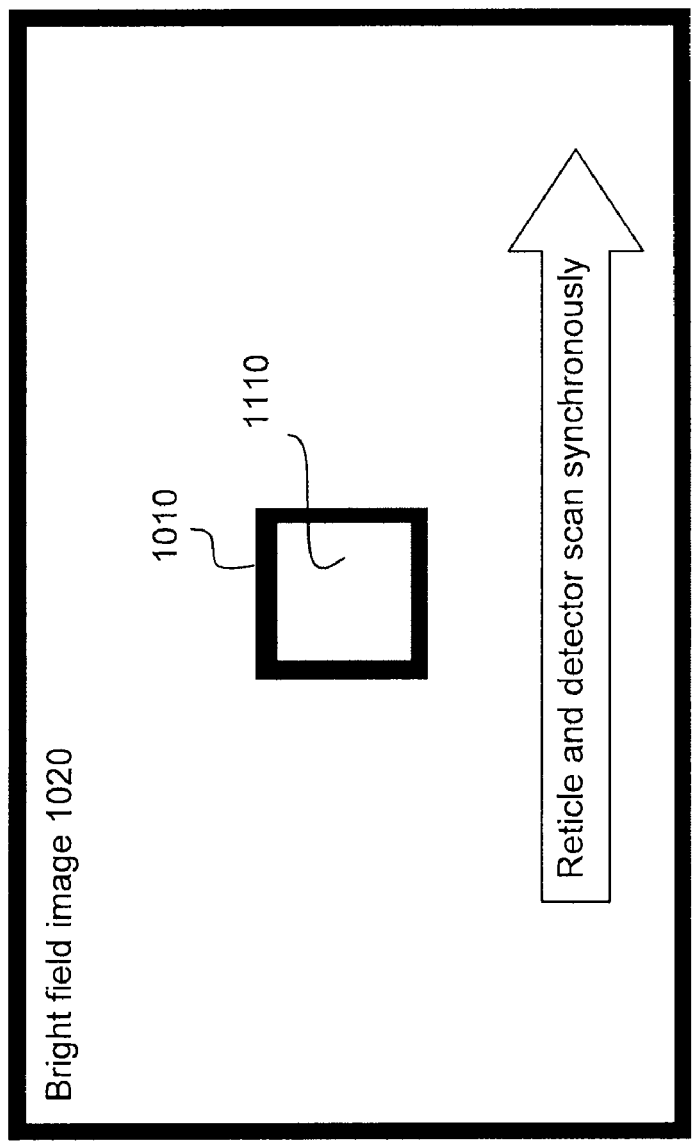
FIGS. 11A and 11B illustrate embodiments of the present invention for a reticle-based lithographic apparatus.

FIG. 11A shows an aperture 1110 of a detector (such as the detector 930 discussed in FIG. 9) provided in the image plane. The shape of the aperture 1110 corresponds to the shape of the image 1010 of the dark area. Aperture 1110 is usually smaller than or equal to the area of image 1010.

Figure 11B:
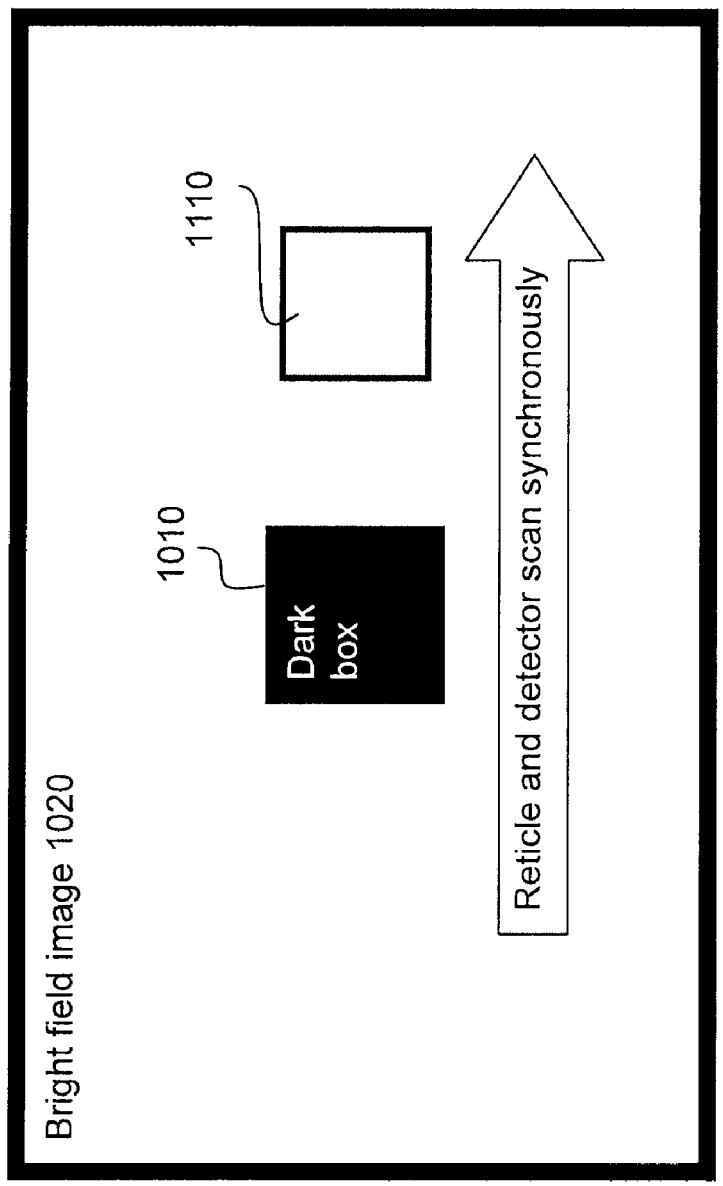
Figure 12E:
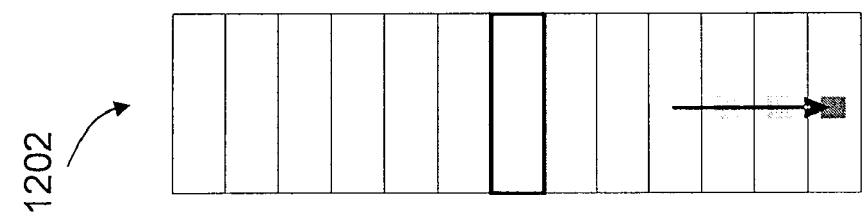
FIGS. 12-14 illustrate various embodiments of the present invention for OML apparatus.
Figure 12D:
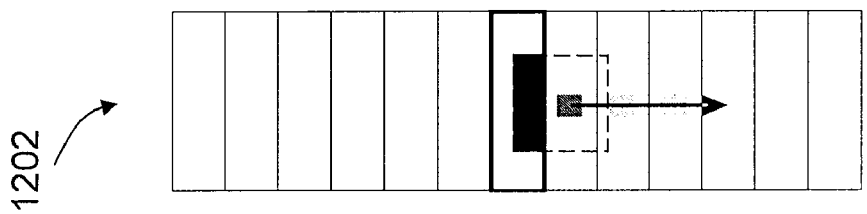
Figure 12C:
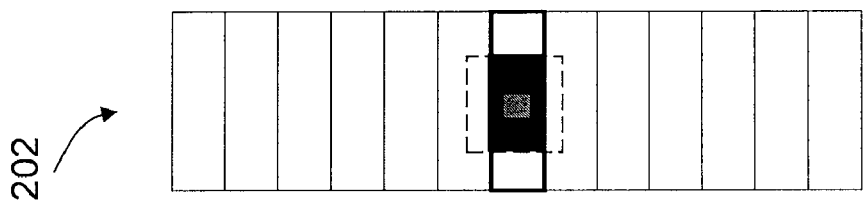
Figure 12B:
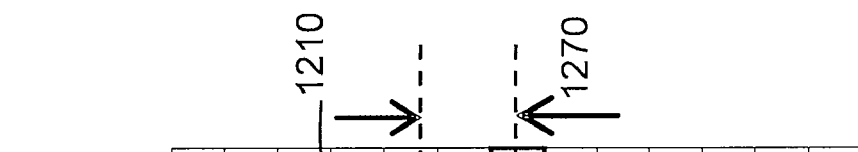
Figure 12A:
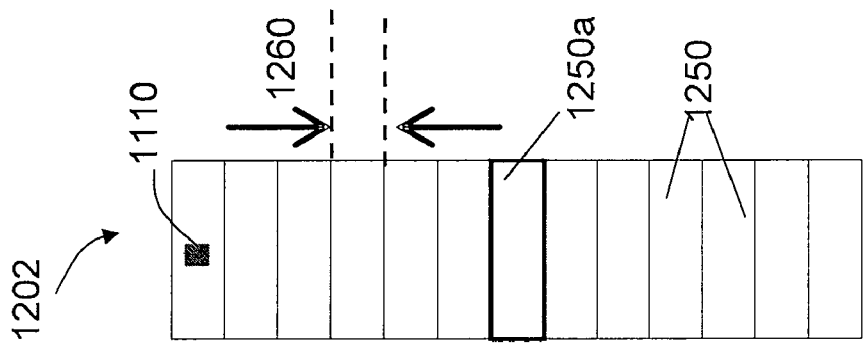

In one embodiment of the radiometric Kirk test, during a dark area scan in a reticle-based lithographic apparatus, aperture 1110 is centered within image 1010 with the help of a positioning mechanism (as shown in FIG. 11A), and both the aperture 1110 and the reticle 500 are scanned synchronously by a moving mechanism across a beam of radiation to cover an entire span of an exposure field of the beam. During a subsequent bright area scan, aperture 1110 is positioned outside the dark area image 1010 and within the bright area image 1020 (at a sufficiently large distance from the dark area image 1010 such that measurement is not affected by the presence of the dark area image 1010) with the help of the positioning mechanism, as shown in FIG. 11B. Once again, both the aperture 1110 and the reticle 500 are scanned synchronously by the moving mechanism across the beam of radiation to cover an entire span of the exposure field of the beam. Thus, the bright field is "virtually" expanded, and enables more accurate measurement of stray light in the lithographic apparatus.

It is to be noted that though in FIGS. 11A and 11B, it is implied that the reticle 500 and aperture 1110 do not have relative motion with respect to each other, in some embodiments of the test, the reticle 500 may be kept stationary, while aperture 1110 is scanned once across the image 1010 of the dark area, and subsequently across the image 1020 of the bright area. This can be done when the bright area on reticle 500 is sufficiently large to begin with.

FIGS. 12-14 depict embodiments of the radiometric Kirk test to be implemented in an OML apparatus. FIGS. 12-14 show a portion 1202 of an entire span of exposure field in an OML apparatus. Portion 1202 comprises a number of consecutive footprints 1250 of an SLM on the image plane as the beam of radiation and/or the SLM itself moves along a scan line. Each of the SLM footprints 1250 indicates an individual imaging field corresponding to a single step of exposure, which is repeated along a scanning direction (shown by a thick arrow in FIGS. 12-14) in a predetermined manner. For example, 1250a depicts a SLM footprint which is currently being irradiated. A distance 1260 traversed along the scanning direction between two consecutive exposures is equal to a dimension of the SLM footprint parallel to the scanning direction. It is to be noted that there may be multiple SLMs, each having a corresponding imaging field. For example, in a particular example OML configuration, 14 SLMs are used in a two row arrangement. For that reason, position-dependent effects of stray light may be expected in an OML apparatus. It is possible to vary reference positions of the test pattern and/or the aperture of the detector to measure this position dependency of stray light.

In one embodiment, a dimension 1270 of image 1210 of the dark area of a test pattern is bigger than the SLM length 1260 along the scanning direction, as shown in FIG. 12. In this case, image 1210 of the dark box is updated synchronously with the movement of the detector aperture 1110 in order to simulate a full-field exposure scan. Detector aperture 1110 is scanned twice, once aligned with the image 1410 of the dark box (dark area scan, as shown in FIGS. 14A-E), and subsequently aligned with the image of the bright field (bright area scan, not shown specifically). It is understood that during a bright area scan, the SLM may be programmed to create an image of a complete bright field without any isolated dark area in the center. As mentioned before, the scan in an OML may be a continuous scan, or a simulated scan comprising appropriately small steps along a scan line, the later being more applicable for OML.

Figure 13C:
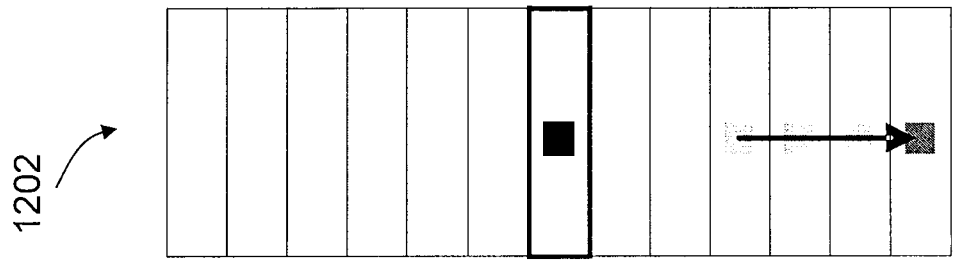
Figure 13B:
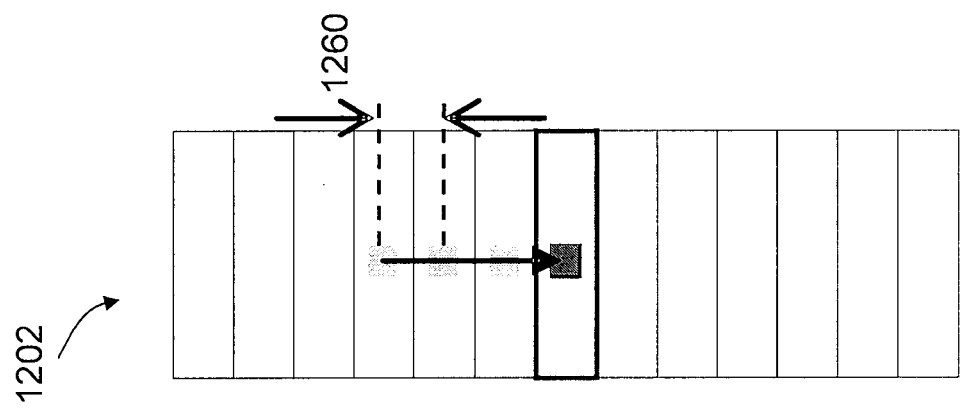
Figure 13A:
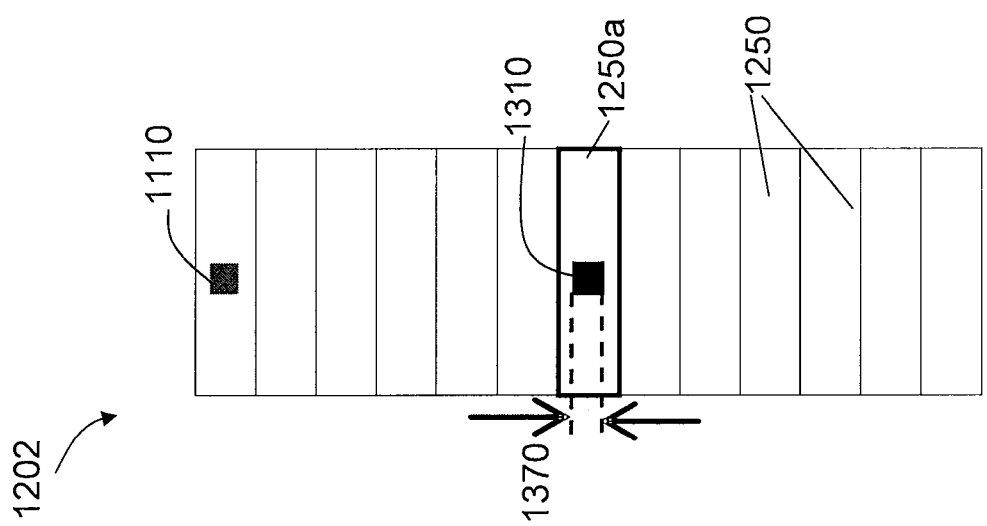

In another embodiment, a dimension 1370 of the image 1310 of the dark area of a test pattern is smaller than the SLM length 1260 along the scanning direction, as shown in FIG. 13A. In this case, image 1310 is kept constant. In order to simulate a full-field exposure, detector aperture 1110 is scanned twice, once across the image 1310 of the dark box (dark area scan, as shown in FIGS. 13A-C), and subsequently across the image of the bright field (bright area scan, as shown in FIGS. 14A-C).

Integrated signals from the dark area scan and the bright area scan are compared to compute stray light metrics.

Methods for Performing Radiometric Kirk Test

FIG. 15 shows a flowchart 1500 comprising example steps of a method for performing a radiometric Kirk test in a lithographic apparatus. The steps of the flowchart 1500 are for illustrative purpose only, and do not have to take place in the order shown. There may be additional intermediate steps that are not shown in FIG. 15. Some of the steps may be optional, and/or specific to particular embodiments. All embodiments may not use all the steps shown in FIG. 15. Additionally, components shown in FIG. 15 are configured to execute various functional steps shown in FIG. 15. However, the method of flowchart 1500 is not limited to the embodiment shown in FIG. 15, and can be executed by other system embodiments as well.

Flowchart 1500 begins with step 1510, in which a test pattern is provided with an isolated dark area surrounded by a large bright area. The test pattern may be provided on a reticle or by other pattern projection means, such as the patterning devices used in an OML apparatus. The test pattern receives a beam of radiation and patterns the beam to create a projected image on an image plane.

In the next step 1515, a detector is placed on the image plane with its aperture positioned in alignment with the image of the dark area. In case of a synchronous scanning, the aperture of the detector may be positioned centered within the image of the dark area. This step is a precursor for a dark area measurement.

In the next step 1520, the aperture is moved in a predetermined manner so that the aperture either crosses a stationary image of the dark box, or moves in a synchronous manner with a scanning image of the dark box.

In the next step 1525, a radiation intensity is measured corresponding to each position of the aperture of the detector during the dark area measurement.

In the next step 1530, measured intensity values are integrated (or averaged) to yield a first integrated signal representing the dark area measurement.

In next step 1535, a detector is placed on the image plane with its aperture positioned in alignment with the image of the bright area. In case of a synchronous scanning, the aperture of the detector may be positioned at a position within the image of the bright area, such that the relative position of the image of the dark area and the aperture do not change during subsequent scanning. This step is a precursor for a bright area measurement.

In the next step 1540, the aperture is moved in a predetermined manner so that the aperture either moves across a stationary image of the bright field, or moves in a synchronous manner with a scanning image of the bright field.

In the next step 1545, a radiation intensity is measured corresponding to each position of the aperture of the detector during the bright area measurement.

In the next step 1550, measured intensity values are integrated (or averaged) to yield a second integrated signal representing the bright area measurement.

In step 1555, one or more stray light metrics are computed by comparing the first and the second integrated signals representing the dark area measurement and the bright area measurement, respectively.

In step 1560, an output is communicated based on the computed results of step 1555 indicating the amount and effects of stray light in the lithographic apparatus. The output is used to monitor performance of the lithographic apparatus. If required, components, configurations, and operational parameters of the lithographic apparatus may be corrected or adjusted. For example, a lens may be cleaned or replaced, or a dose level of the beam of radiation may be adjusted, so that negative effects of stray light are countered, and better contrast is obtained in lithographic imaging.

While FIG. 15 illustrates a generic method of radiometric Kirk test that can be executed in any type of lithographic apparatus, FIG. 16 shows a flowchart 1600 comprising some additional example steps required in a step-and-scan type lithographic apparatus, such as an OML. The steps of the flowchart 1600 are applicable to dark area measurement as well as bright area measurement. The steps of flowchart 1600 are for illustrative purpose only, and do not have to take place in the order shown. There may be additional intermediate steps that are not shown in FIG. 16. Some of the steps may be optional, and/or specific to particular embodiments. All embodiments may not use all the steps shown in FIG. 16.

Flowchart 1600 starts with step 1610, where an aperture of a detector is positioned in line with an intended portion of an image of a test pattern. In case of a dark area measurement, the initial location is aligned to an image of a dark box of a test pattern. In case of a bright area measurement, the initial location is aligned to an image of a bright field of the test pattern.

In the next step 1615, a radiation source (e.g., a laser) is turned on. For example, source SO in FIGS. 1-3 may be turned on.

In step 1620, the aperture moves to an exposure location.

In step 1625, the exposure location is exposed statically. The exposure can last for a duration of a single pulse, or a predetermined number of pulses (e.g., 100 pulses) of the radiation source. Using a plurality of pulses at a single exposure location averages out noise in radiation energy, and ensures more or less uniform radiation energy imparted at every exposure location along a direction of scanning.

In step 1630, a radiation intensity is measured. Measured intensity data is stored for a subsequent integration operation in a processor. In step 1635, the radiation source is turned off.

As indicated by the loop 1640, the process goes back to step 1610 to check (and if necessary, adjust) alignment of the aperture with respect to a desired test pattern, and eventually the aperture is moved to a next exposure location. Then, the steps of the flowchart 1600 repeat until a complete scan is performed.

Though not explicitly shown in flowchart 1600, it is implied that after all completion of both the dark area measurement and the bright area measurement, flowchart 1600 follows integration steps similar to steps 1630 and 1650 in flowchart 1600, and proceeds to a computing and indicating steps similar to steps 1655 and 1660 of flowchart 1600.

The descriptions above are intended to be illustrative, not limiting. Thus, it will be apparent to one skilled in the art that modifications may be made to the invention as described without departing from the scope of the claims set out below.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   an illumination system configured to produce a beam of radiation;
   a test pattern configured to facilitate measuring stray light, wherein the test pattern comprises a dark area surrounded by a bright area, and wherein the bright area is substantially larger than the dark area;
   a detector having an aperture in an image plane where a projected image of the test pattern is created, wherein a shape of the aperture corresponds to a shape of the dark area;
   a positioning mechanism configured to position the aperture of the detector at a first and a second location, the first location being aligned to an image of the dark area, and the second location being aligned to an image of the bright area;
   a moving mechanism configured to move the aperture of the detector in the image plane and to move the projected image of the test pattern substantially synchronously with the aperture of the detector, the aperture being positioned initially in the first location during a dark area measurement, and the aperture being positioned initially in the second location during a subsequent bright area measurement;
   a transducer coupled to the detector that measures radiation intensity during the dark area measurement and the bright area measurement;
   a processor coupled to the transducers that compares a first integrated signal representing a result of the dark area measurement, and a second integrated signal representing a result of the bright area measurement to yield a final result that indicates effects of stray light in the lithographic apparatus; and
   an output indicator coupled to the processor that communicates an output to facilitate monitoring and evaluation of performance of the lithographic apparatus, wherein the output is generated based on the final result.

2. The apparatus of claim 1, wherein the moving mechanism is configured to cover an entire span of an exposure field.

3. The apparatus of claim 1, wherein the first location of the aperture of the detector comprises a concentric location within the image of the dark area.

4. The apparatus of claim 1, wherein the moving mechanism is configured to perform a continuous scan.

5. The apparatus of claim 1, wherein the illumination system comprises an intensity monitor that measures an intensity of the beam of radiation before the beam is received by the test pattern.

6. The apparatus of claim 1, wherein the apparatus is an optical maskless lithography (OML) apparatus having one or more arrays of individually controllable optical elements as a patterning device that creates the test pattern.

7. The OML apparatus of claim 6, wherein the moving mechanism is further configured to move the aperture of the detector in sequential steps at predetermined consecutive exposure positions.

8. The OML apparatus of claim 7, wherein a distance between two predetermined consecutive exposure positions is determined by a dimension of a footprint of an array of individually controllable optical elements.

9. The apparatus of claim 1, wherein an area of the aperture is equal to or smaller than an area of the image of the dark area.

10. The apparatus of claim 1, wherein the dark area comprises one of a dark square, a dark circle, or a dark rectangle.

11. A method of measuring stray light, comprising:
    providing a test pattern configured to receive a beam of radiation, wherein the test pattern comprises a dark area surrounded by a bright area, and wherein the bright area is substantially larger than the dark area;
    providing a detector having an aperture in an image plane where a projected image of the test pattern is created, wherein a shape of the aperture corresponds to a shape of the dark area;
    positioning the aperture of the detector at a first location aligned to an image of the dark area;
    moving the projected image of the test pattern synchronously with the aperture of the detector;
    measuring radiation intensity detected during the movement of the aperture of the detector to yield a first integrated signal representing a result of the dark area measurement;
    positioning the aperture of the detector at a second location aligned to an image of the bright area;
    moving the projected image of the test pattern synchronously with the aperture of the detector;
    measuring radiation intensity detected during the movement of the aperture of the detector to yield a second integrated signal representing a result of the bright area measurement;
    comparing the first integrated signal and the second integrated signal to yield a final result that indicates effects of stray light in a lithographic apparatus;
    communicating an output to facilitate monitoring and evaluation of performance of the lithographic apparatus, wherein the output is generated based on the final result.

12. The method of claim 11, wherein the method further comprises:
    moving the aperture of the detector to cover an entire span of an exposure field during the dark area measurement and the bright area measurement.

13. The method of claim 12, wherein the method further comprises:
    changing a reference position of the projected image of the test pattern to measure position dependency of stray light within the span of the exposure field.

14. The method of claim 11, wherein the dark area measurement further comprises:
    turning the beam of radiation on;
    statically exposing the aperture of the detector positioned at a predetermined dark field exposure location;
    measuring intensity from the predetermined dark field exposure location;
    turning off the beam of radiation; and
    moving the aperture of the detector to a next predetermined dark field exposure location along a scan line that passes through the image of the dark area.

15. The method of claim 14, wherein the static exposure step further comprises:
pulsing the beam of radiation for a predetermined number of times.

16. The method of claim 14, wherein an initial predetermined dark field exposure location coincides with the first location aligned to the image of the dark area.

17. The method of claim 11, wherein the bright measurement further comprises:
turning the beam of radiation on;
statically exposing the aperture of the detector positioned at a predetermined bright field exposure location;
measuring intensity from the predetermined bright field exposure location;
turning off the beam of radiation; and
moving the aperture of the detector to a next predetermined bright field exposure location along a scan line that passes through the image of the bright area.

18. The method of claim 17, wherein the static exposure step farther comprises:
pulsing the beam of radiation for a predetermined number of times.

19. The method of claim 17, wherein an initial predetermined bright field exposure location coincides with the second location aligned to the image of the bright area.

20. The method of claim 11, wherein the method further comprises:
providing an intensity monitor to measure an intensity of the beam of radiation before the beam is received by the test pattern; and
normalizing the radiation intensity detected during the movement of the aperture of the detector across the image of the dark area and the image of the bright area using the intensity of the beam of radiation as detected by the intensity monitor.

21. The method of claim 11, wherein the method further comprises:
adjusting operational parameters of the lithographic apparatus based on the generated output to counter effects of stray light.

22. The method of claim 11, wherein the method further comprises:
inspecting components along an optical path to detect sources of stray light.

23. The method of claim 11, wherein the method further comprises:
moving the projected image of the test pattern synchronously with the aperture of the detector so that the aperture of the detector is centered within the image of the dark area.

24. A method of measuring stray light in a lithographic system, the method comprising:
scanning a reticle at least twice with a beam of radiation, the reticle having an isolated dark area within a relatively larger surrounding bright field;
scanning an aperture of a detector in an image plane of a lithographic system substantially synchronously with the scanning of the reticle, wherein during a first synchronous scan of the isolated dark area by the aperture of the detector, the aperture is positioned such that at least at one point, the aperture of the detector is centered within an image of the isolated dark area, and wherein during a second synchronous scan of the bright field by the aperture of the detector, the aperture is positioned outside the image of the isolated dark area, but within an image of the surrounding bright field;
determining a first detector signal value from a first scan of the reticle and the first synchronous scan Of the isolated dark area by the aperture of the detector;
determining a second detector signal value from a second scan of the reticle and the second synchronous scan of the bright field by the aperture of the detector; and
providing a ratio of a dose level from the first detector signal value and the second detector signal value as a measure of stray light present in the lithographic system.

25. The method of claim 24, wherein the method further comprises:
covering an entire span of an exposure field during the first synchronous scan and the second synchronous scan.

26. The method of claim 25, wherein the method further comprises:
changing a reference position of the projected image of the reticle to measure position dependency of stray light within the span of the exposure field.

27. The method of claim 24, wherein the method further comprises:
providing an intensity monitor to measure an intensity of the beam of radiation before the beam is received by the reticle; and
normalizing the radiation intensity detected during the first synchronous scan and the second synchronous scan using the intensity of the beam of radiation as detected by the intensity monitor.

28. The method of claim 24, wherein the method further comprises:
adjusting a dose level of the lithographic system based on the measure of stray light present in the lithographic system.

29. The method of claim 24, wherein the method further comprises:
inspecting components along an optical path to detect sources of stray light present in the lithographic system.

* * * * *

UNITED STATES PATENT AND TRADEMARK OFFICE
CERTIFICATE OF CORRECTION

| | | |
|---|---|---|
| PATENT NO. | : 8,059,266 B2 | Page 1 of 1 |
| APPLICATION NO. | : 12/236050 | |
| DATED | : November 15, 2011 | |
| INVENTOR(S) | : Hult et al. | |

It is certified that error appears in the above-identified patent and that said Letters Patent is hereby corrected as shown below:

Column 23, line 21, Claim 18, please delete "farther" and replace with "further"
Column 24, line 17, Claim 24, please delete "Of" and replace with "of"

Signed and Sealed this
Seventh Day of February, 2012

David J. Kappos
*Director of the United States Patent and Trademark Office*